United States Patent
Hong et al.

(10) Patent No.: US 6,775,417 B2
(45) Date of Patent: Aug. 10, 2004

(54) FIXED-RATE BLOCK-BASED IMAGE COMPRESSION WITH INFERRED PIXEL VALUES

(75) Inventors: Zhou Hong, Cupertino, CA (US); Konstantine I. Iourcha, San Jose, CA (US); Krishna S. Nayak, Palo Alto, CA (US)

(73) Assignee: S3 Graphics Co., Ltd., Grand Cayman (KN)

( * ) Notice: Subject to any disclaimer, the term of this patent is extended or adjusted under 35 U.S.C. 154(b) by 165 days.

(21) Appl. No.: 10/052,613

(22) Filed: Jan. 17, 2002

(65) Prior Publication Data

US 2003/0053706 A1 Mar. 20, 2003

(Under 37 CFR 1.47)

Related U.S. Application Data

(63) Continuation-in-part of application No. 09/351,930, filed on Jul. 12, 1999, now Pat. No. 6,658,146, which is a continuation of application No. 08/942,860, filed on Oct. 2, 1997, now Pat. No. 5,956,431.

(51) Int. Cl.[7] ............................................. G06K 9/38
(52) U.S. Cl. ........................ 382/253; 382/232; 725/146
(58) Field of Search ............................... 382/166, 162, 382/232, 253; 725/146; 345/549, 550; 358/539

(56) References Cited

U.S. PATENT DOCUMENTS

| | | | |
|---|---|---|---|
| 4,821,208 A | 4/1989 | Ryan et al. | 345/550 |
| 4,887,151 A | 12/1989 | Wataya | 358/539 |
| 5,734,744 A | 3/1998 | Wittenstein et al. | 382/166 |
| 5,742,892 A | 4/1998 | Chaddha | 725/146 |
| 5,748,904 A | 5/1998 | Huang et al. | 345/544 |
| 5,787,192 A | 7/1998 | Takaichi et al. | 382/166 |
| 5,822,465 A | 10/1998 | Normile et al. | 382/253 |
| 5,956,425 A | 9/1999 | Yoshida | 382/234 |
| 5,956,431 A | 9/1999 | Iourcha et al. | 382/253 |
| 6,075,619 A | 6/2000 | Iizuka | 382/166 |

FOREIGN PATENT DOCUMENTS

| | | | | |
|---|---|---|---|---|
| JP | 401284188 A | * | 11/1989 | H04N/7/137 |
| JP | 405216993 | | 8/1993 | G06F/15/70 |

OTHER PUBLICATIONS

Feng et al., "A Dynamic Address Vector Quantization Based on Inter–Block and Inter–Color Correction for Color Image Coding,"IEEE International Conference on Acoustics, Speech and Signal Processing, vol. 3, May 1989, pp. 1755–1758.

Schilling et al., "Texram: A Smart Memory for Texturing," IEEE Computer Graphics & Applications, May 1996, vol. 16, No. 3, pp. 9–19.

(List continued on next page.)

*Primary Examiner*—Anh Hong Do
(74) *Attorney, Agent, or Firm*—Carr & Ferrell LLP

(57) ABSTRACT

An image processing system including an image encoder and image decoding system is provided. The image encoder system includes an image decomposer, a block encoder, and an encoded image composer. The image decomposer decomposes the image into blocks. The block encoder which includes a selection module, a codeword generation module and a construction module, processes the blocks. Specifically, the selection module computes a set of parameters from image data values of a set of image elements in the image block. The codeword generation module generates codewords which the construction module uses to derive a set of quantized image data values. The construction module then maps each of the image element's original image data values to an index to one of the derived image data values. The image decoding system reverses this process to reorder decompressed image blocks in an output data file.

30 Claims, 16 Drawing Sheets

OTHER PUBLICATIONS

Knittel et al., "Hardware and Software for Superior Texture Performance," In 10: Eurographics Hardware Workshop 1995, Maastricht, The Netherlands, Aug. 28–29, 1995, pp. 1–8.

Campbell et al., "Two Bit/Pixel Full Color Encoding," Computer Graphics (Proc. SIGPRAPH 1986), Aug. 18–22, 1986, vol. 20, No. 4, Dallas, TX, pp.215–219.

Yang et al., "Hybrid Adaptive Block Truncation Coding for Image Compression," Optical Engineering, Soc. of Photo–Optical Instrumentation Engineers, Bellingham, USA, Vo. 36, No. 4, Apr. 1, 1997, pp. 1021–1027.

Kugler, "High–Performance Texture Decompression Hardware," Visual Computer, Springer, Berlin, Germany, vol. 13, No. 2, 1997, pp. 51–63.

Panos Nasiopoulos et al., "Adaptive Compression Coding," IEEE Transactions on Communications, IEEE Inc., New York, USA, vol. 39, No. 8, Aug. 1, 1991, pp. 1245–1254.

Delp E.J. et al., "Image Compression Using Block Truncation Coding," IEEE Inc., New York, USA, vol. COM–27, No. 9, Sep. 1979, pp. 1335–1342.

Yang et al., "Use of Radius Weighted Mean to Cluster Two–Class Data," Electronics Letters, IEE Stevenage, Great Britain, vol. 30, No. 10, May 12, 1994, pp. 757–759.

Russ, J.C. et al., "Optimal Grey Scale Images from Multiplane Color Images," Journal of Computer–Assisted Microscopy, Dec. 1995, Plenum, USA, vol. 7, No. 4, pp. 221–233.

Knittel et al., "Hardware for Superior Texture Performance," Eurographics Workshop on Graphics Hardware, Jul. 28, 1995, pp. 33–40.

* cited by examiner

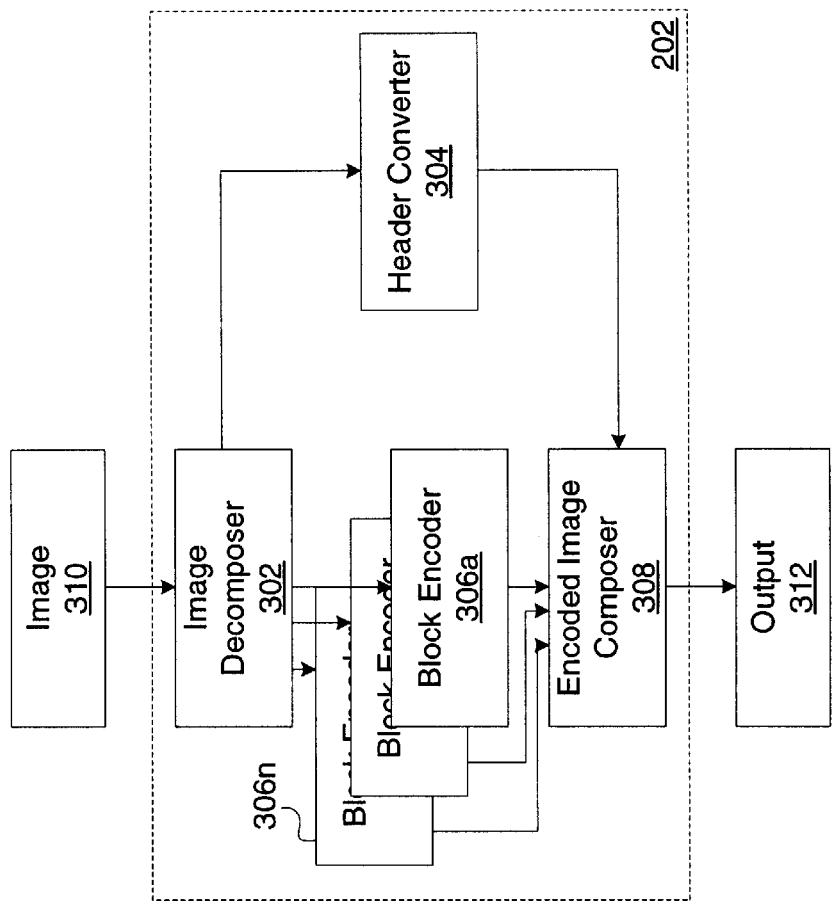
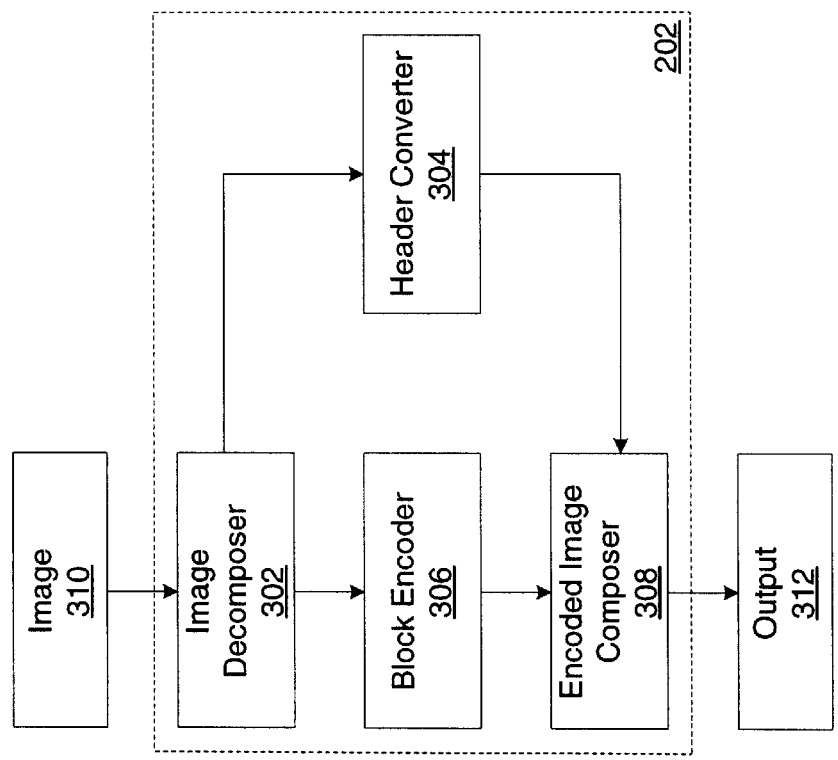

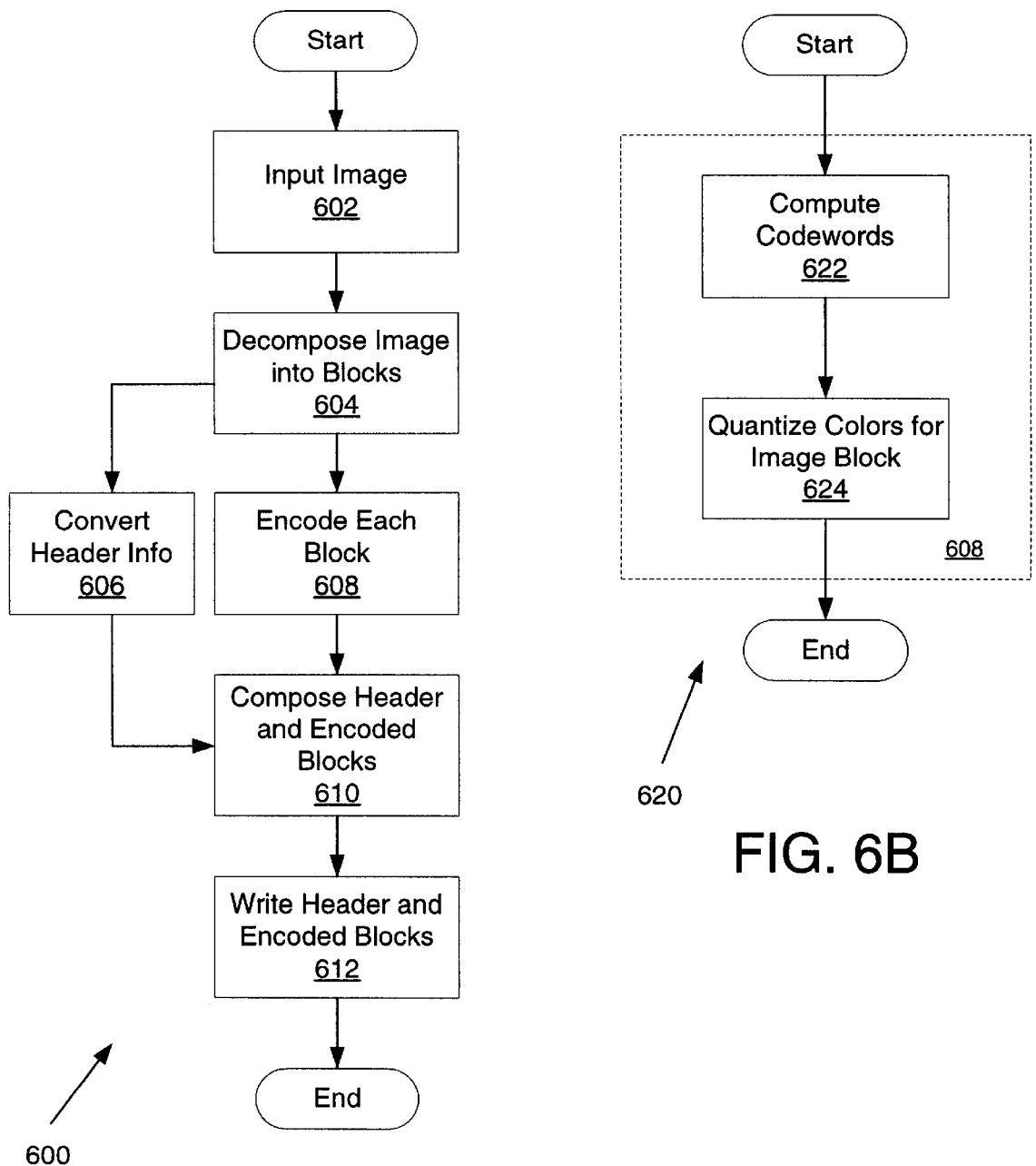

FIXED-RATE BLOCK-BASED IMAGE COMPRESSION WITH INFERRED PIXEL VALUES

CROSS-REFERENCES TO RELATED APPLICATIONS

This application is a continuation-in-part application of Ser. No. 09/351,930 filed Jul. 12, 1999 now U.S. Pat. No. 6,658,146, which is a continuation of Ser. No. 08/942,860 filed Oct. 2, 1997, now U.S. Pat. No. 5,956,431 issued Sep. 21, 1999.

BACKGROUND OF THE INVENTION

1. Field of the Invention

The present invention relates generally to image processing, and more particularly to three-dimensional rendering using fixed-rate image compression.

2. Description of Related Art

Conventionally, generating images, such as realistic and animated graphics on a computing device, required tremendous memory bandwidth and processing power on a graphics system. Requirements for memory and processing power are particularly true when dealing with three-dimensional images. In order to reduce bandwidth and processing power requirements, various compression methods and systems have been developed including Entropy or lossless encoders, Discrete Cosine Transform ("DCT") or JPEG type compressors, block truncation coding, and color cell compression. However, these methods and systems have numerous disadvantages.

Entropy or lossless encoders include Lempel-Ziv encoders which rely on predictability. For data compression using entropy encoders, a few bits are used to encode most commonly occurring symbols. In stationary systems where probabilities are fixed, entropy coding provides a lower bound for compression than can be achieved with a given alphabet of symbols. However, coding does not allow random access to any given symbol. Part of the compressed data preceding a symbol of interest must be first fetched and decompressed to decode the symbol, requiring considerable processing time and resources, as well as decreasing memory throughput. Another problem with existing Entropy methods and systems is that no guaranteed compression factor is provided. Thus, this type of encoding scheme is impractical where memory size is fixed.

Discrete Cosine Transform or JPEG-type compressors allow users to select a level of image quality. With DCT, uncorrelated coefficients are produced so that each coefficient can be treated independently without loss of compression efficiency. The DCT coefficients can be quantized using visually-weighted quantization values which selectively discard least important information.

DCT, however, suffers from a number of shortcomings. One problem with DCT and JPEG-type compressors is a requirement of large blocks of pixels, typically, 8×8 or 16×16 pixels, as a minimally accessible unit in order to obtain a reasonable compression factor and quality. Access to a very small area, or even a single pixel involves fetching a large quantity of compressed data; thus requiring increased processor power and memory bandwidth. A second problem is that the compression factor is variable, therefore requiring a complicated memory management system that, in turn, requires greater processor resources. A third problem with DCT and JPEG-type compression is that using a large compression factor significantly degrades image quality. For example, an image may be considerably distorted with a form of ringing around edges in the image as well as noticeable color shifts in areas of the image. Neither artifact can be removed with subsequent low-pass filtering.

A further disadvantage with DCT and JPEG-type compression is the complexity and significant hardware cost for a compressor and decompressor ("CODEC"). Furthermore, high latency of a decompressor results in a large additional hardware cost for buffering throughout the system to compensate for the latency. Finally, DCT and JPEG-type compressors may not be able to compress a color keyed image.

Block truncation coding ("BTC") and color cell compression ("CCC") use a local one-bit quantizer on 4×4 pixel blocks. Compressed data for such a block consists of only two colors and 16-bits that indicate which of the two colors is assigned to each of 16 pixels. Decoding a BTC/CCC image consists of using a multiplexer with a look-up table so that once a 16-texel (or texture element, which is the smallest addressable unit of a texture map) block (32-bits) is retrieved from memory, the individual pixels are decoded by looking up the two possible colors for that block and selecting the color according to an associated bit from 16 decision bits.

Because the BTC/CCC methods quantize each block to just two color levels, significant image degradation may occur. Further, a two-bit variation of CCC stores the two colors as 8-bit indices into a 256-entry color lookup table. Thus, such pixel blocks cannot be decoded without fetching additional information which may consume additional memory bandwidth.

The BTC/CCC methods and systems can use a 3-bit per pixel scheme which stores the two colors as 16-bit values (not indices into a table) resulting in pixel blocks of six bytes. Fetching such units, however, decreases system performance because of additional overhead due to memory misalignment. Another problem associated with BTC/CCC methods is a high degradation of image quality when used to compress images that use color keying to indicate transparent pixels.

Therefore, there is a need for a system and method that maximizes accuracy of compressed images while minimizing storage, memory bandwidth requirements, and decoding hardware complexities. There is a further need for compressing image data blocks into convenient sizes to maintain alignment for random access to any one or more pixels.

SUMMARY OF THE INVENTION

The present invention provides for fixed-rate block based image compression with inferred pixel values. An image processing system includes an image encoder engine and an image decoder engine. The image encoder engine includes an image decomposer, at least one block encoder, and an encoded image composer. The block decomposer decomposes an original image into a header and a plurality of blocks which are composed of a plurality of image elements or pixels. The block encoder subsequently processes each block. The block encoder includes a selection module, a codeword generation module, and a construction module. Specifically, the selection module computes a set of parameters from image data values of each set of image elements. The codeword generation module then generates codewords which are reference image data values such as colors or density values. Subsequently, the construction module uses the codewords to derive a set of quantized image data values. The construction module then maps each of the image element's original image data values with an index to one of the derived image data values. Finally, the codewords and indices are output as encoded image blocks.

Conversely, the image decoder engine includes an encoded image decomposer, at least one block decoder, and an image composer. The image decomposer takes the encoded image and decomposes the encoded image into a header and plurality of encoded image blocks. The block decoder uses the codewords in the encoded image blocks to generate a set of derived image data values. Subsequently, the block decoder maps the index values for each image element to one of the derived image data values. The image composer then reorders the decompressed image blocks in an output data file, which is forwarded to a display device.

BRIEF DESCRIPTION OF THE DRAWINGS

FIG. 3A is a block diagram of one embodiment of an image encoder system;

FIG. 3B is a block diagram of an alternative embodiment of an image encoder system;

FIGS. 6A–6E are flowcharts illustrating encoding processes, according to the present invention;

DESCRIPTION OF THE PREFERRED EMBODIMENT

Figure 1:
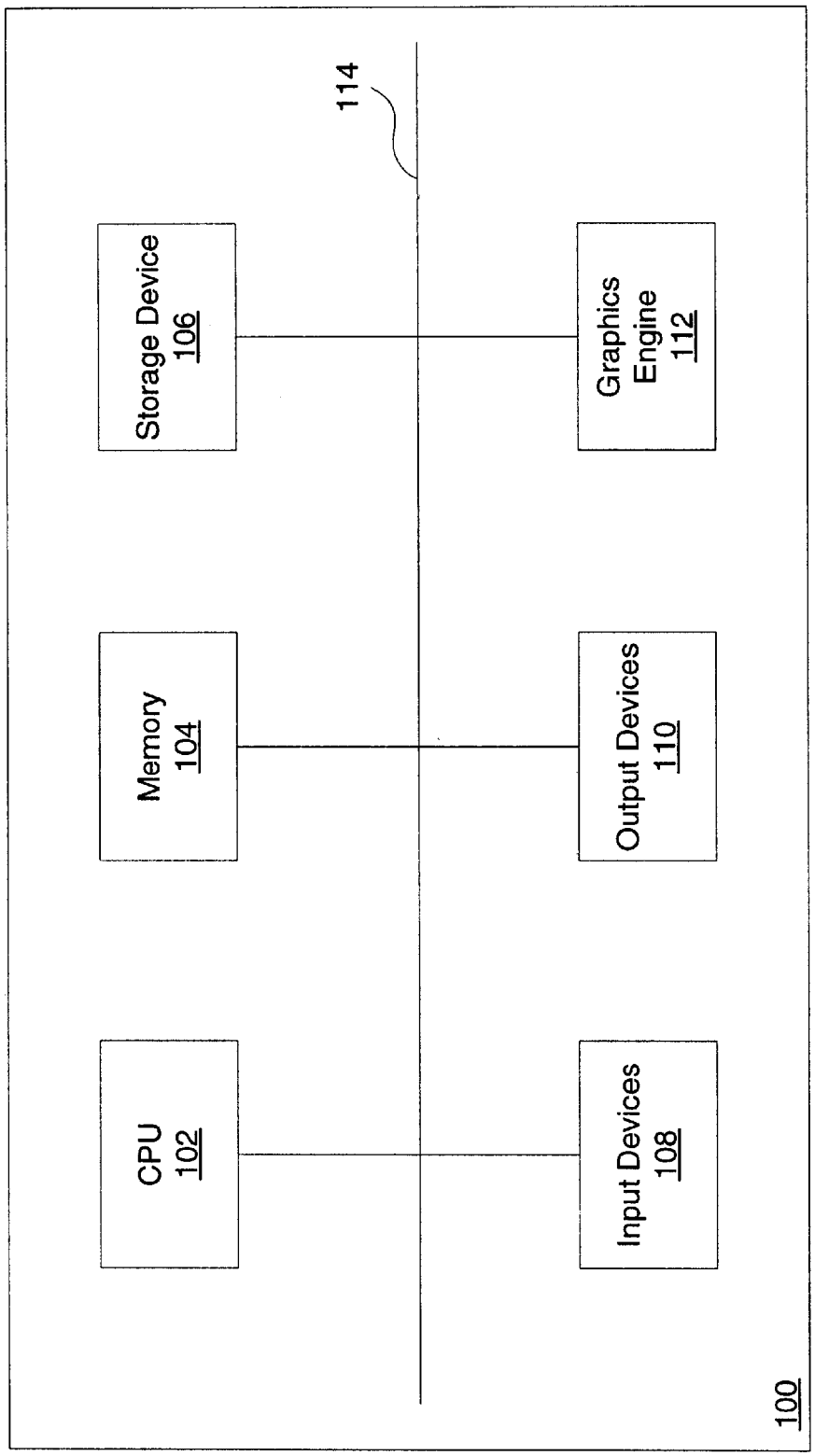
FIG. 1 is a block diagram of a data processing system, according to an embodiment of the present invention.

FIG. 1 is a block diagram of a data processing system 100 for implementing the present invention. The data processing system 100 includes a CPU 102, a memory 104, a storage device 106, input devices 108, output devices 110, and a graphics engine 112 all of which are coupled to a system bus 114. The memory 104 and storage device 106 store data within the data processing system 100. The input device 108 inputs data into the data processing system 100, while the output device 110 receives data from the data processing system 100. Although the data bus 114 is shown as a single line, alternatively, the data bus 114 may be a combination of a processor bus, a PCI bus, a graphic bus, or an ISA bus.

Figure 2:
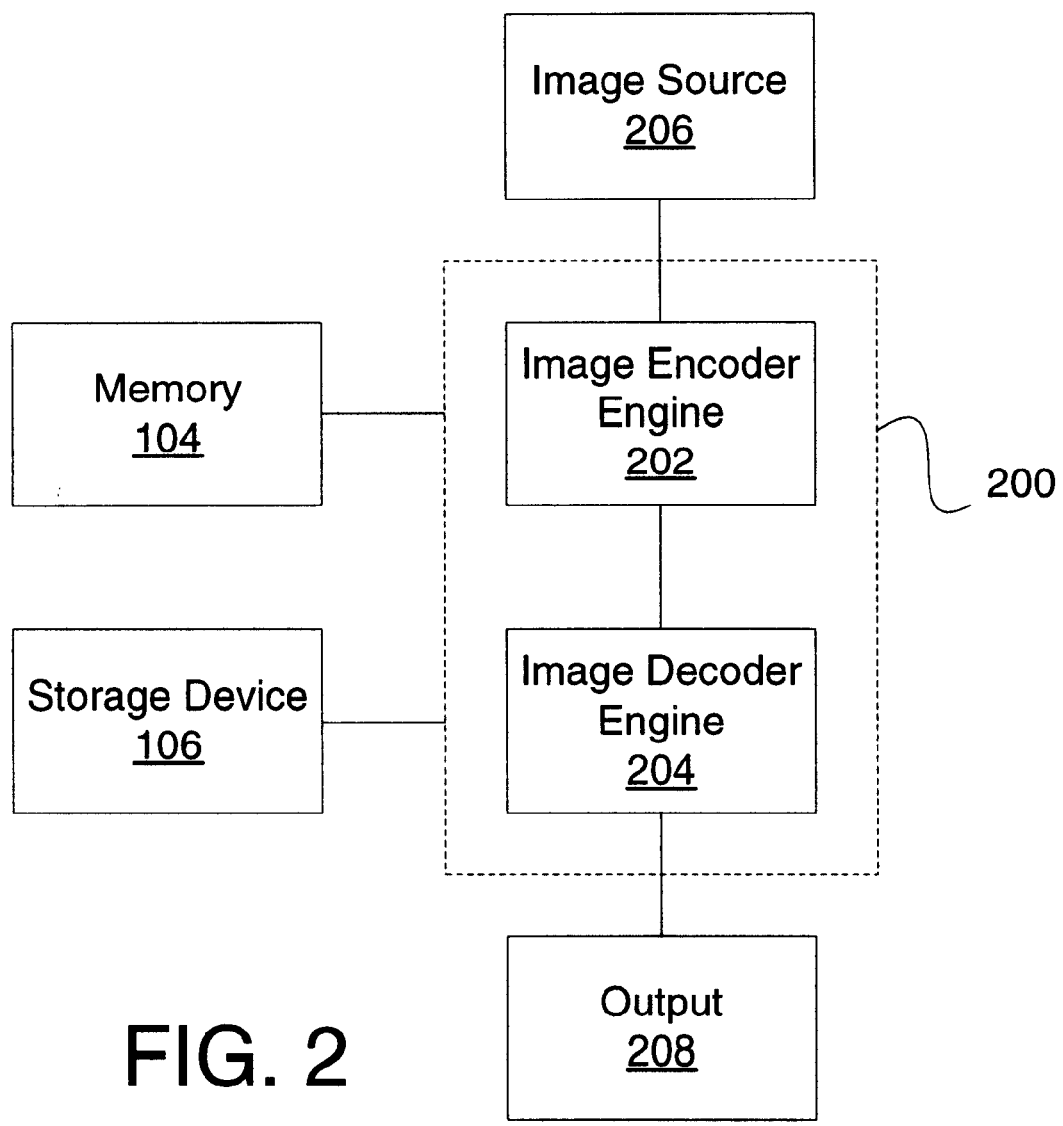
FIG. 2 is a block diagram of an image processing system.

FIG. 2 is a block diagram of an exemplary image processing system 200. In one embodiment, the image processing system 200 is contained within the graphics engine 112 (FIG. 1). The image processing system 200 includes an image encoder engine 202 and an image decoder engine 204. The image processing system 200 may also include, or be coupled to, an image source unit 206 which provides images to the image encoder engine 202. Further, the image processing system 200 may include or be coupled to an output unit 208 to which processed images are forwarded for storage or further processing. Additionally, the image processing system 200 may be coupled to the memory 104 (FIG. 1) and the storage device 106 (FIG. 1). In an alternative embodiment, the image encoder engine 202 and the image decoder engine 204 are contained within different computing devices, and the encoded images pass between the two engines 202 and 204.

Within the image encoder engine 202, images are broken down into individual blocks and processed before being forwarded, for example, to the storage device 106 as compressed or encoded image data. When the encoded image data are ready for further processing, the encoded image data are forwarded to the image decoder engine 204. The image decoder engine 204 receives the encoded image data and decodes the data to generate an output that is a representation of the original image that was received from the image source unit 206.

FIGS. 3A and 3B are block diagrams illustrating two exemplary embodiments of the image encoder engine 202 of FIG. 2. The image encoder engine 202 includes an image decomposer 302, a header converter 304, one or more block encoders 306 in FIG. 3A (306a–306n, where n is the nth encoder in FIG. 3B), and an encoded image composer 308. The image decomposer 302 is coupled to receive an original image 310 from a source, such as the image source unit 206 (FIG. 2), and forwards information from a header of the original image 310 to the header converter 304. Subsequently, the header converter 304 modifies the original header to generate a modified header, as will be described further in connection with FIG. 5B. The image decomposer 302 also breaks, or decomposes, the original image 310 into R numbers of image blocks, where R is any integer value. The number of image blocks the original image 310 is broken into may depend on the number of image pixels. In an exemplary embodiment, the image 310 having A image pixels by B image pixels will, typically, be (A/4)×(B/4) blocks. For example, an image that is 256 pixels by 256 pixels will be broken down into 64×64 blocks. In the present embodiment, the image is decomposed such that each image block is 4 pixels by 4 pixels (16 pixels). Those skilled in the art will recognize that the number of pixels or the image block size may be varied.

Figure 3D:
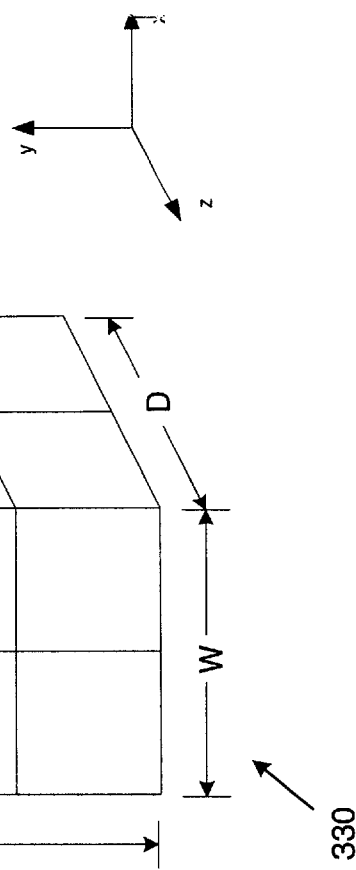
FIG. 3D is a graphical representation of a three-dimensional image block.
Figure 3C:
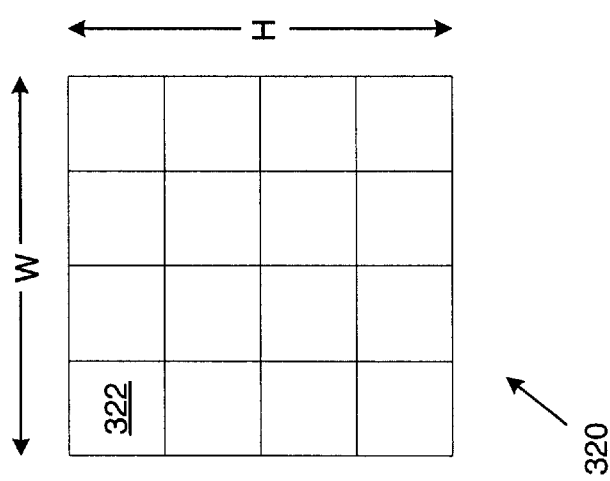
FIG. 3C is a graphical representation of an image block.

Briefly turning to FIG. 3C, an example of a single image block 320 is illustrated. The image block 320 is composed of image elements (pixels) 322. The image block 320 may be defined as an image region W pixels in width by H pixels in height. In the embodiment of FIG. 3C, the image block 320 is W=4 pixels by H=4 pixels (4×4).

In an alternative embodiment, the original image 310 (FIG. 3A or 3B) may be a three-dimensional volume data set as shown in FIG. 3D. FIG. 3D illustrates an exemplary three-dimensional image block 330 made up of sixteen image elements (volume pixels or voxels) 332. Image block 330 is defined as an image region W voxels in width, H voxels in height, and D voxels in depth.

The three-dimensional volume data set may be divided into image blocks of any size or shape. For example, the image may be divided along a z-axis into a plurality of x×y×z sized images, where z=1. Each of these x×y×1 images may be treated similarly with two-dimensional images, where each x×y×1 image is divided into two-dimensional image blocks, as described above with respect to FIG. 3C. However, decomposing the three-dimensional image into two-dimensional "slices" for compression does not fully utilize the graphical similarities that may exist in the z (depth) direction in a three-dimensional image. To utilize such similarities, the volume data may be decomposed into a plurality of three-dimensional image blocks. It will be understood that in alternative embodiments, other combinations of W×H×D are possible, and may be more desirable, depending on the data being compressed.

This type of three-dimensional image data is used, for example, in medical imaging applications such as ultrasound or magnetic resonance imaging ("MRI"). In such an application, a body part is scanned to produce a three-dimensional matrix of image elements (i.e., image block comprised of voxels 320). The image is x voxels wide by y voxels high by z voxels deep. In this example, each voxel provides density data regarding characteristics of body tissue. In ultrasound applications, each voxel may be provided with a brightness level indicating the strength of echoes received during scanning.

In the embodiment of FIG. 3D, the original image 310 is a three-dimensional data volume where the image data are density values. In alternative embodiments, other scalar data types may be represented in the original image 310, such as transparency or elevation data. In further embodiments, vector data, such as the data used for "bump maps", may be represented.

Referring back to FIGS. 3A and 3B, each block encoder 306 receives an image block 320 from the image decomposer 302, and encodes or compresses each image block 320. Subsequently, each encoded image block is forwarded to the encoded image composer 308 which orders the encoded image blocks in a data file. Next, the data file from the encoded image composer 308 is concatenated with the modified header from the header converter 304 to generate an encoded image data file that is forwarded to an output 312. Thus, the modified header and the encoded image blocks together form the encoded image data that represent the original image 310. Alternatively, having more than one block encoder 306a–306n, as shown in FIG. 3B, allows for encoding multiple image blocks simultaneously, one image block per block encoder 306a–306n, within the image encoder engine 202. Advantageously, simultaneous encoding increases image processing efficiency and performance.

The image data associated with the original image 310 may be in any one of a variety of formats including red-green-blue ("RGB"), YUV 420 (YUV are color models representing luminosity and color difference signals), YUV 422, or a propriety color space. In some cases, conversion to a different color space before encoding the original image 310 may be useful. In one embodiment, each image block 320 is a 4×4 set of pixels where each pixel 322 is 24-bits in size. For each pixel 322, there are 8-bits for a Red("R")-channel, 8-bits for a Green("G")-channel, and 8-bits for a Blue("B")-channel in an RGB implementation color space. Alternatively, each encoded image block is also a 4×4 set of pixels with each pixel being only 2-bits in size and having an aggregate size of 4-bits as will be described further below.

Figure 4:
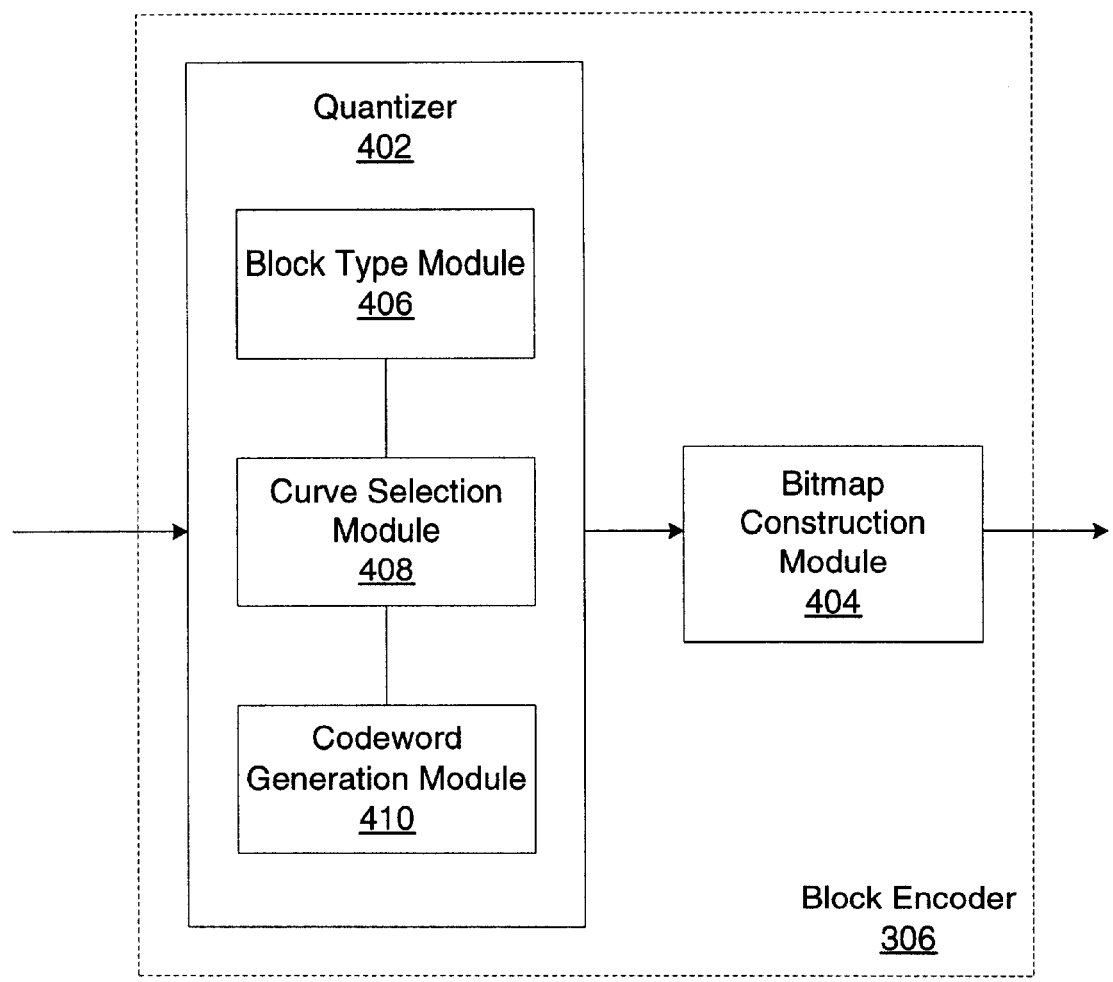
FIG. 4 is a block diagram of an image block encoder of FIG. 2A, 3A, or 3B.

FIG. 4 is a block diagram illustrating an exemplary block encoder 306 of FIGS. 3A and 3B. The block encoder 306 includes a quantizer 402 and a bitmap construction module 404. Further, the quantizer 402 includes a block type module 406, a curve selection module 408, and a codeword generation module 410.

Each image block 320 (FIG. 3C) of the decomposed original image 310 (FIGS. 3A and 3B) is received and initially processed by the quantizer 402 before being forwarded to the bitmap construction module 404. The bitmap construction module 404 outputs encoded image blocks for the encoded image composer 308 (FIGS. 3A and 3B) to order. The bitmap construction module 404 and the modules of the quantizer 402 are described in more detail below.

Figure 5A:
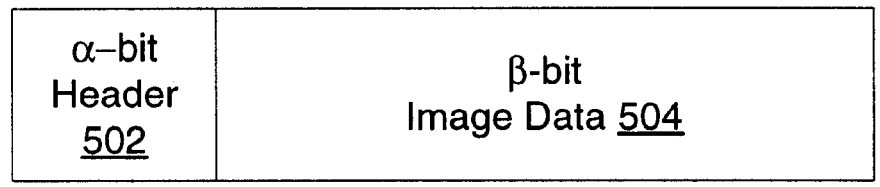
FIG. 5A is a data sequence diagram of an original image.

Briefly, FIG. 5A is a diagram of a data sequencer or string 500 representing the original image 310 (FIGS. 3A and 3B) that is received by the block decomposer 302 (FIGS. 3A and 3B). The data string 500 includes an $\alpha$-bit header 502 and a $\beta$-bit image data 504. The header 502 may include information such as pixel width, pixel height, format of the original image 310 (e.g., number of bits to the pixel in RGB or YUV format), as well as other information. The image data 504 are data representing the original image 310, itself.

Figure 5B:
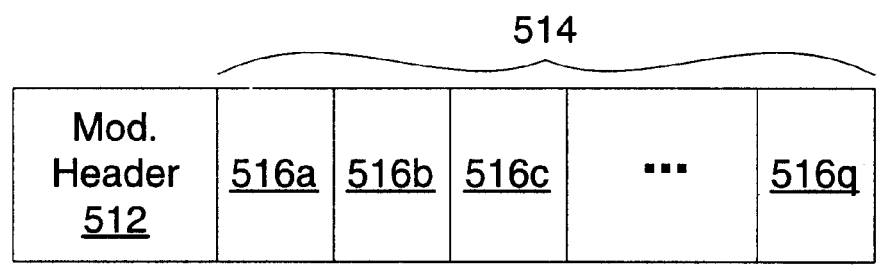
FIG. 5B is a data sequence diagram of encoded image data of an original image output from the image encoder system.

FIG. 5B is a diagram of a data sequence or string 510 representing encoded image data that are generated by the image encoder engine 202 (FIG. 2). The encoded image data string 510 includes a modified header portion 512 and an encoded image block portion 514. The modified header portion 512 is generated by the header converter 304 (FIGS. 3A and 3B) from the original $\alpha$-bit header 502 (FIG. 5A) and includes information about file type, number of bits per pixel of the original image 310 (FIGS. 3A and 3B), addressing in the original image 310, other miscellaneous encoding parameters, as well as the width and height information indicating size of the original image 310. The encoded image block portion 514 includes encoded image blocks 516a–q from the block encoders 306 (FIGS. 3A and 3B) where q is the number of blocks resulting from the decomposed original image 310.

Figure 5C:
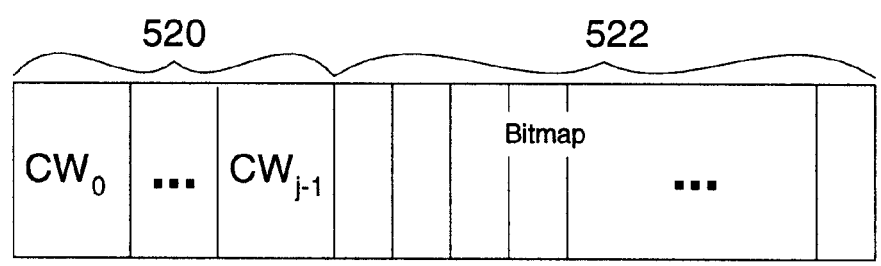
FIG. 5C is a data sequence diagram of an encoded image block from the image block encoder of FIG. 4.

FIG. 5C is a diagram of a data sequence or string 518 representing an encoded image block. The data string 518 may be similar to any one of the encoded image blocks 516a–q (FIG. 5B) shown in the encoded image data string 510 of FIG. 5B.

The encoded image block data string 518 includes a codeword section 520 and a bitmap section 522. The codeword section 520 includes j codewords, where j is an integer value, that are used to compute colors of other image data indexed by the bitmap section 522. A codeword is an n-bit data string that identifies a pixel property, such as color component, density, transparency, or other image data values. In one embodiment, there are two 16-bit codewords $CW_0$ and $CW_1$ (j=2). The bitmap section 522 is a Q-bit data portion and is described in more detail in connection with FIG. 6B.

In an alternative embodiment, each encoded image block is 64-bits, which includes two 16-bit codewords and a 32-bit (4×4×2 bit) bitmap 522. Encoding the image block 320 (FIG. 3C) as described above provides greater system flexibility and increased data processing efficiency. In a further exemplary embodiment, each 32-bit bitmap section 522 may be a three-dimensional 32-bit bitmap.

FIGS. 6A–6E describe operations of the image encoder engine 202 (FIG. 2). In flowchart 600, a general operation of the image encoder engine 202 is shown. In block 602, a data string 500 (FIG. 5A) of the original image 310 (FIGS. 3A and 3B), which includes the $\alpha$-bit header 502 (FIG. 5A) and the $\beta$-bit image data 504 (FIG. 5A), is input into the image decomposer 302 (FIGS. 3A and 3B). The image decomposer 302 decomposes the image 310 into the α-bit header and a plurality of blocks in block 604. The α-bit header 502 is then forwarded to the header converter 304 (FIGS. 3A and 3B). Subsequently, the header converter 304 generates a modified header 512 (FIG. 5B) from the α-bit header 502 in block 606. The modified header 512 is then forwarded to the encoded image composer 308 (FIGS. 3A and 3B).

Simultaneous with the header conversion process, each image block 320 is encoded in block 608 by one or more of the block encoders 306a–306n (FIGS. 3A and 3B) to generate the encoded image blocks 516 (FIG. 5B). Each image block 320 may be processed sequentially in one block encoder 306, or multiple image blocks 320 may be processed in parallel in multiple block encoders 306a–306n.

The encoded image blocks 516 are output from the block encoders 306, and are placed into a predefined order by the encoded image composer 308. In one embodiment, the encoded image blocks 516 are arranged in a file from left to right and top to bottom in the same order in which the encoded image blocks 516 were broken down by the image decomposer 302 (FIGS. 3A and 3B). The image encoder engine 202 subsequently composes the modified header information 512 from the header converter 304 and the encoded image blocks 516a–516q in block 610. Specifically, the modified header 512 and the ordered encoded image blocks 516 are concatenated to generate the encoded image data file 510 (FIG. 5B), which may be written as encoded output 312 (FIGS. 3A and 3B) to the memory 104, storage device 106, or any output device 110 (FIG. 1) in block 612.

Figure 6C:
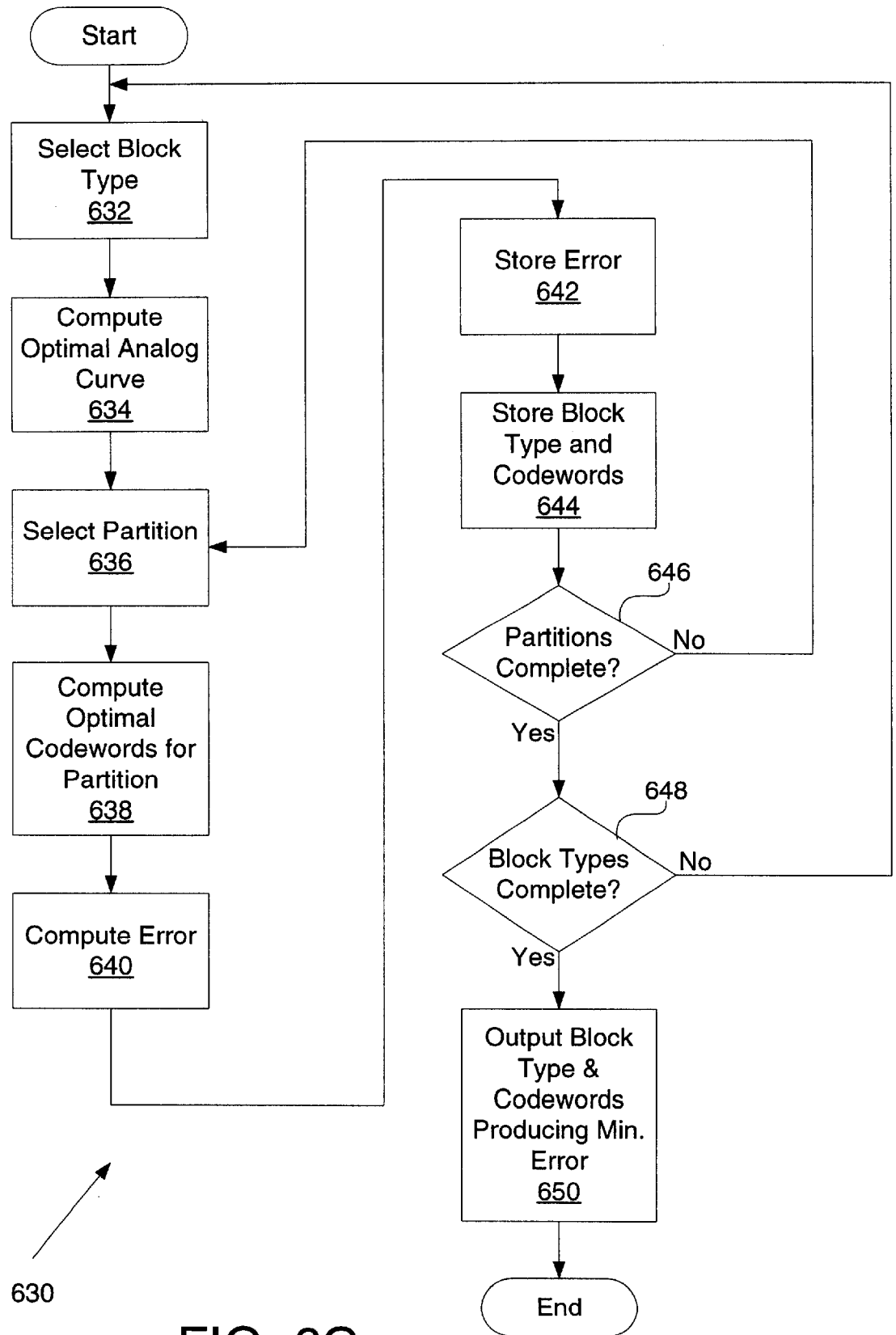

FIG. 6B is a flowchart 620 showing the encoding process of block 608 (FIG. 6A) in more detail. In block 622, codewords 520 (FIG. 5C) are computed by the codeword generation module 410 (FIG. 4). The process for computing these codewords 520 is described in more detail in connection with FIG. 6C.

Once the codewords 520 have been computed, pixel values or properties, such as colors, for the image block 320 (FIG. 3C) are computed or quantized in block 624. Specifically, the codewords 520 provide points in a pixel space from which m quantized pixel values may be inferred. The m quantized pixel values are a limited subset of pixels in a pixel space that are used to represent the current image block. The process for quantizing pixel values, and more specifically colors, will be described infra in connection with FIGS. 8A and 8B. Further, the embodiments will now be described with respect to colors of a pixel value although one skilled in the art will recognize that, in general, any pixel value may be used with respect to the present invention. Therefore, the image data which is quantized may be any form of scalar or vector data, such as density values, transparency values, and "bump map" vectors.

In an exemplary embodiment, each pixel is encoded with two bits of data which can index one or m quantized colors, where m=4 in this embodiment. Further, four quantized colors are derived from the two codewords 520 where two colors are the codewords 520, themselves, and the other two colors are inferred from the codewords 520, as will be described below. It is also possible to use the codewords 520 so that there is one index to indicate a transparent color and three indices to indicate colors, of which one color is inferred.

In another embodiment, the bitmap 522 (FIG. 5C) is a 32-bit data string. The bitmap 522 and codewords 520 are output in block 624 as a 64-bit data string representing an encoded image block 518. Specifically, the encoded image block 514 (FIG. 5B) includes two 16-bit codewords 520 (n=16) and a 32-bit bitmap 522. Every codeword 520 that is a 16-bit data string includes a 5-bit red-channel, 6-bit green-channel, and 5-bit blue-channel.

Each of the encoded image blocks 516 is placed together and concatenated with modified header information 512 derived from the original α-bit header 502 of the original image 310 (FIGS. 3A and 3B). A resulting output is the encoded image data 510 representing the original image 310.

FIG. 6C is a flowchart 630 illustrating a process for computing codewords for the image blocks 320 (FIG. 3C), and relates to color quantizing using quantizer 402 (FIG. 4). The process for computing codewords can be applied to all scalar and vector image data types. In select block type 632, the quantizer 402 uses the block type module 406 (FIG. 4) to select a first block type for the image block 320 that is being processed. For example, a selected block type may be a four-color or a three-color plus transparency block type, where the colors within the particular block type have equidistant spacing in a color space. Those of ordinary skill in the art will readily recognize that selecting a block type for each image is not intended to be limiting in any way. Instead, the present invention processes image blocks that are of a single block type, which eliminates the need to distinguish between different block types, such as the three- and four-color block types discussed above. Consequently, the block type module 406 and select block type 632 are optional.

Once the block type is selected, the quantizer 402 computes an optimal analog curve for the block type in block 634. Computation of the optimal analog curve will be further described in connection with FIG. 6D. The analog curve is used to simplify quantizing of the colors in the image block. Subsequently, in block 636, the quantizer 402 selects a partition of points along the analog curve, which is used to simplify quantizing of the colors in the image block. A partition may be defined as a grouping of indices {1 . . . (W×H)} into m nonintersecting sets. In one embodiment, the indices (1 . . . 16) are divided into three or four groups or clusters (i.e., m=3 or 4) depending on the block type.

Once a partition is selected, optimal codewords for the particular partition are computed in block 638. In addition to computing the codewords, an error value (square error as described infra) for the codeword is also computed in block 640. Both computations will be described in more detail in connection with FIG. 6E. If the computed error value is the first error value, the error value is stored in block 642. Alternatively, the computed error value is stored if it is less than the previously stored error value. For each stored error value, corresponding block type and codewords are also stored in block 644. The process of flowchart 630 seeks to find the block type and codewords that minimize the error function.

Next in block 646, the code generation module 410 (FIG. 4) determines if all possible partitions are completed. If there are more partitions, the code generation module 410 selects the next partition, computes the codewords and associated error values, and stores the error values, associated block types, and codewords if the error value is less than the previously stored error value.

After all the possible partitions are completed, the codeword generation module 410 determines, in block 648, whether all block types have been selected. If there are more block types, the codeword generation module 410 selects the next block type and computes the codeword and various values as previously described. After the last block type has been processed, the codeword generation module 410 outputs a result of the block type and codewords 520 (FIG. 5C) having the minimum error in block 650.

In an alternative embodiment, the optimal analog curve may be computed before selecting the block type. That is, the optimal analog curve is computed before the selection of the block type and partition, computation of the codewords and error values, and storage of the error value, block type, and codeword. Computing the optimal analog curve first is useful if all block types use the same analog curve and color space because the analog curve does not need to be recomputed for each block type.

Figure 6D:
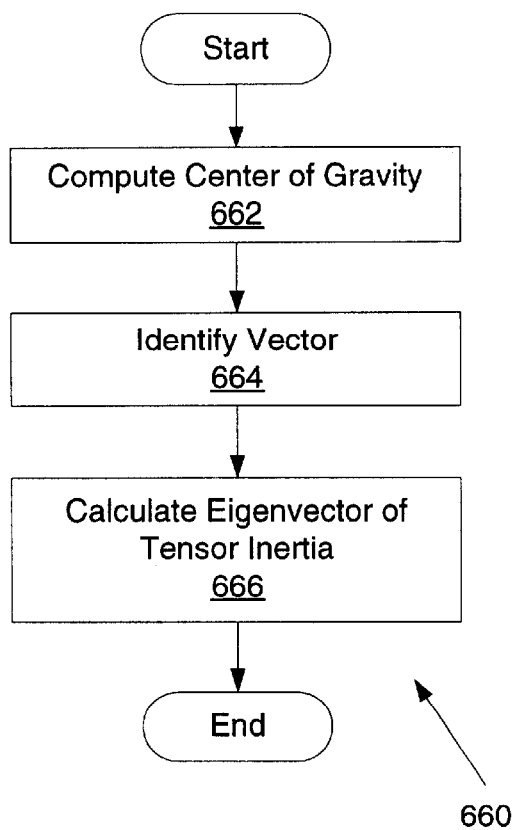

FIG. 6D is a flowchart 660 describing a process of identifying the optimal analog curve. The curve selection module 408 (FIG. 4) first computes a center of gravity for pixel colors of an image block 320 (FIG. 3C) in block 662. The center of gravity computation includes averaging the pixel colors. Once the center of gravity is computed, a vector in color space is identified in block 664 to minimize the first moment of the pixel colors of the image block 320. Specifically for identifying a vector, a straight line is fit to a set of data points, which are the original pixel colors of the image block 320. The straight line is chosen passing through the center of gravity of the set of data points such that it minimizes a "moment of inertia" (i.e., square error). For example, to compute a direction of a line minimizing the moment of inertia for three pixel properties, tensor inertia, T, is calculated from individual colors as follows:

$$T = \sum_{i=1}^{W \times H} \begin{bmatrix} C_{1i}^2 + C_{2i}^2 & -C_{0i}C_{1i} & -C_{0i}C_{2i} \\ -C_{0i}C_{1i} & C_{0i}^2 + C_{2i}^2 & -C_{1i}C_{2i} \\ -C_{0i}C_{2i} & -C_{2i}C_{1i} & C_{0i}^2 + C_{1i}^2 \end{bmatrix}$$

where $C_0$, $C_1$, and $C_2$ represent pixel properties (e.g., color components in RGB or YUV) relative to a center of gravity. In one embodiment of an RGB color space, $C_{0i}$ is a value of red, $C_{1i}$ is a value of green, and $C_{2i}$, is a value of blue for each pixel, i, of the image block. Further, i takes on integer values from 1 to W×H, so that if W=4 and H=4, i ranges from 1 to 16.

An eigenvector of tensor inertia, T, with the smallest eigenvalue is calculated in block 666 using conventional methods. An eigenvector direction along with the calculated gravity center, defines an axis that minimizes the moment of inertia. This axis is used as the optimal analog curve, which in one embodiment, is a straight line. Those of ordinary skill in the art will readily recognize that the optimal analog curve is not limited to a straight line, but may include a set of parameters, such as pixel values or colors, that minimizes the moment of inertia or mean-square-error when fit to the center of gravity of the pixel colors in the image block. The set of parameters may define any geometric element, such as a curve, plate, trapezoid, or the like.

Figure 6E:
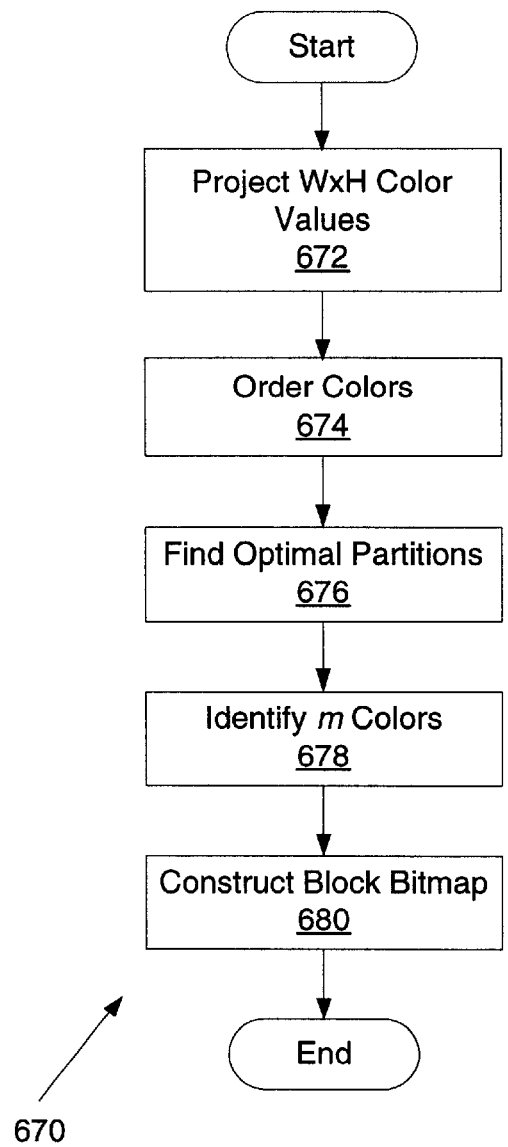

FIG. 6E is a flowchart 670 describing the process undertaken by the codeword generation module 410 (FIG. 4) for selecting the partitions, computing the codewords and associated error for the partitions, and storing the error value, block type, and codeword if the error value is less than a previously stored error value. In block 672, the codeword generation module 410 projects the W×H color values onto the previously constructed optimal analog curve. The value of W×H is the size in number of pixels of an image block 320 (FIG. 3C). In one embodiment where W and H are both four pixels, W×H is 16 pixels.

Subsequently in block 674, the colors are ordered sequentially along the analog curve based on a position of the color on a one-dimensional analog curve. After the colors are ordered, the codeword generation module 410 searches, in block 676, for optimal partitions. Thus, the codeword generation module 410 takes the W×H colors (one color associated with each pixel) that are ordered along the analog curve and partitions and groups the colors into a finite number of clusters with a predefined relative spacing. In one embodiment where W=4 and H=4 (i.e., W×H is 16), the 16 colors are placed in three and four clusters (i.e., m=3 or 4).

In conducting the search for the optimal partition, a color selection module within the codeword generation module 410 finds the best m clusters from the W×H points projected onto the optimal curve, so that the error associated with the selection is minimized. The best m clusters are determined by minimizing the mean-square-error with the constraint that the points associated with each cluster are spaced to conform to the predefined spacing.

In one embodiment for a block type of four equidistant colors, the error may be defined as a square error along the analog curve, such as $$E^2 = \sum_{cluster\,0} (x_i - p_0)^2 + \sum_{cluster\,1} \left[x_i - \left(\frac{2}{3}p_0 + \frac{1}{3}p_1\right)\right]^2 + \sum_{cluster\,2} \left[x_i - \left(\frac{1}{3}p_0 + \frac{2}{3}p_1\right)\right]^2 + \sum_{cluster\,3} (x_i - p_1)^2$$

where E is the error for the particular grouping or clustering, $p_0$ and $p_1$ are the coded colors, and $x_i$ are the projected points on the optimal analog curve.

In instances where the block type indicates three equidistant colors, the error may be defined as a squared error along the analog curve, such as $$E^2 = \sum_{cluster\,0} (x_i - p_0)^2 + \sum_{cluster\,1} \left[x_i - \left(\frac{1}{2}p_0 + \frac{1}{2}p_1\right)\right]^2 + \sum_{cluster\,2} (x_i - p_1)^2$$

After the resulting optimal codewords 520 are identified, the codewords 520 are forwarded to the bitmap construction module 404 (FIG. 4). The bitmap construction module 404 uses the codewords 520 to identify the m colors that may be specified or inferred from those codewords 520 in block 678. In one embodiment, the bitmap construction module 404 uses the codewords 520 (e.g., $CW_0$ and $CW_1$) to identify the three or four colors that may be specified or inferred from those codewords 520.

Next in block 680, the bitmap construction module 404 constructs a block bitmap 522 (FIG. 5C) using the codewords 520 associated with the image block 320 (FIG. 3C). Colors in the image block 320 are mapped to the closest color associated with one of the quantized colors specified by, or inferred from, the codewords 520. The result is a color index, referenced as ID, per pixel in the block identifying the associated quantized color.

Information indicating the block type is implied by the codewords 520 and the bitmap 522. In one embodiment, the order of the codewords 520 indicate the block type. If a numerical value of $CW_0$ is greater than a numerical value of $CW_1$, the image block is a four-color block. Otherwise, the block is a three-color plus transparency block.

In one embodiment discussed above, there are two-color image block types. One color image block type has four equidistant colors, while the other color image block type has three equidistant colors with the fourth color index used to specify that a pixel is transparent. For both color image block types, the color index is two bits. In an embodiment with density values in place of color values, each density image block type has four equidistant density values.

The output of the bitmap construction module 404 is an encoded image block 514 (FIG. 5B) having the m codewords 520 plus the bitmap 522. Each encoded image block 516 is received by the encoded image composer 308 (FIGS. 3A and 3B) that, in turn, orders the encoded image blocks 516 in a file. In one embodiment, the encoded image blocks 516 are arranged from left to right and from top to bottom in the same order as the blocks were broken down by the image decomposer 302. The ordered file having the encoded image blocks 516 is concatenated with the modified header information 512 that is derived from the α-bit header 502 of the original image 310 (FIGS. 3A and 3B) to generate the encoded image data 510 that is the output of the image encoder engine 202 (FIG. 2). The output may then be forwarded to the memory 104, the storage device 106, or the output device 110 (FIG. 1).

The exemplary embodiment of the image encoder engine 202 advantageously reduces the effective data size of an image from 24-bits per pixel to 4-bits per pixel. Further, the exemplary embodiment beneficially addresses transparency issues by allowing codewords to be used with a transparency identifier.

Figure 7A:
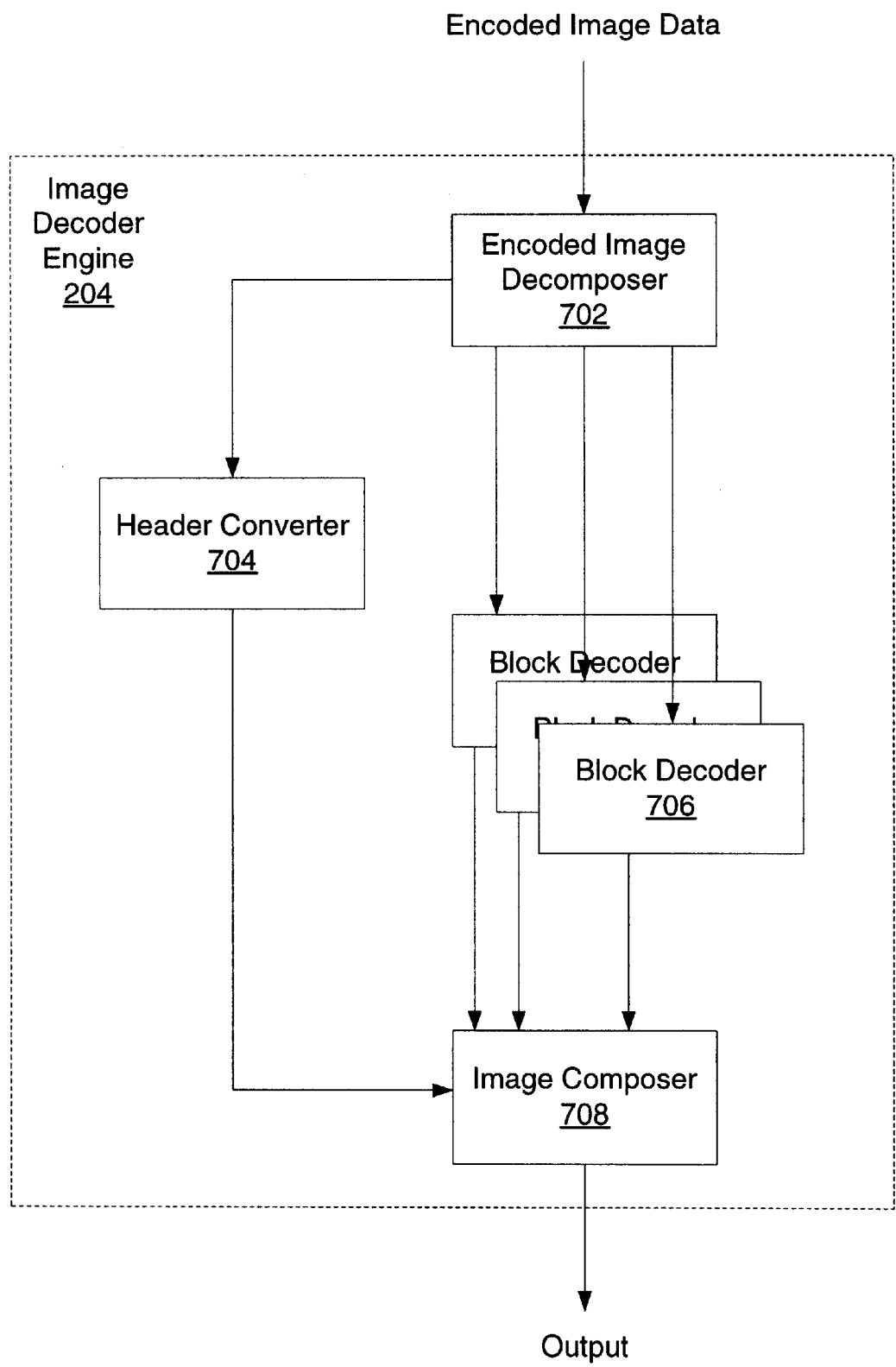
FIG. 7A is a block diagram of an image decoder system.

FIG. 7A is a block diagram of an exemplary image decoder engine 204 (FIG. 2). The image decoder engine 204 includes an encoded image decomposer 702, a header converter 704, one or more block decoders 706 (706a–706p, where p represents the last block decoder), and an image composer 708. The encoded image decomposer 702 is coupled to received the encoded image data 514 (FIG. 5B) output from the image encoder engine 202 (FIG. 2). The encoded image decomposer 702 receives the encoded image data string 510 and decomposes, or breaks, the encoded image data string 510 into the header 512 (FIG. 5B) and the encoded image blocks 514 (FIG. 5B). Next, the encoded image decomposer 702 reads the modified header 512, and forwards the modified header 512 to the header converter 704. The encoded image decomposer 702 also decomposes the encoded image data string 510 into the individual encoded image blocks 516 (FIG. 5B) that are forwarded to the one or more block decoders 706.

The header converter 704 converts the modified header 512 into an output header. Simultaneously, the encoded image blocks 516 are decompressed or decoded by the one or more block decoders 706. Each encoded image block 516 may be processed sequentially in one block decoder 706, or multiple encoded image blocks 514 may be processed in parallel with one block decoder 706 for each encoded image block 516. Thus, multiple block decoders 706 allow for parallel processing that increases the processing performance and efficiency of the image decoder engine 204 (FIG. 2).

The image composer 708 receives each decoded image blocks from the one or more block decoders 706 and orders the decoded image block in a file. Further, the image composer 708 receives the converted header from the header converter 704. The converted header and the decoded image blocks are placed together to generate output data representing the original image 310.

Figure 7B:
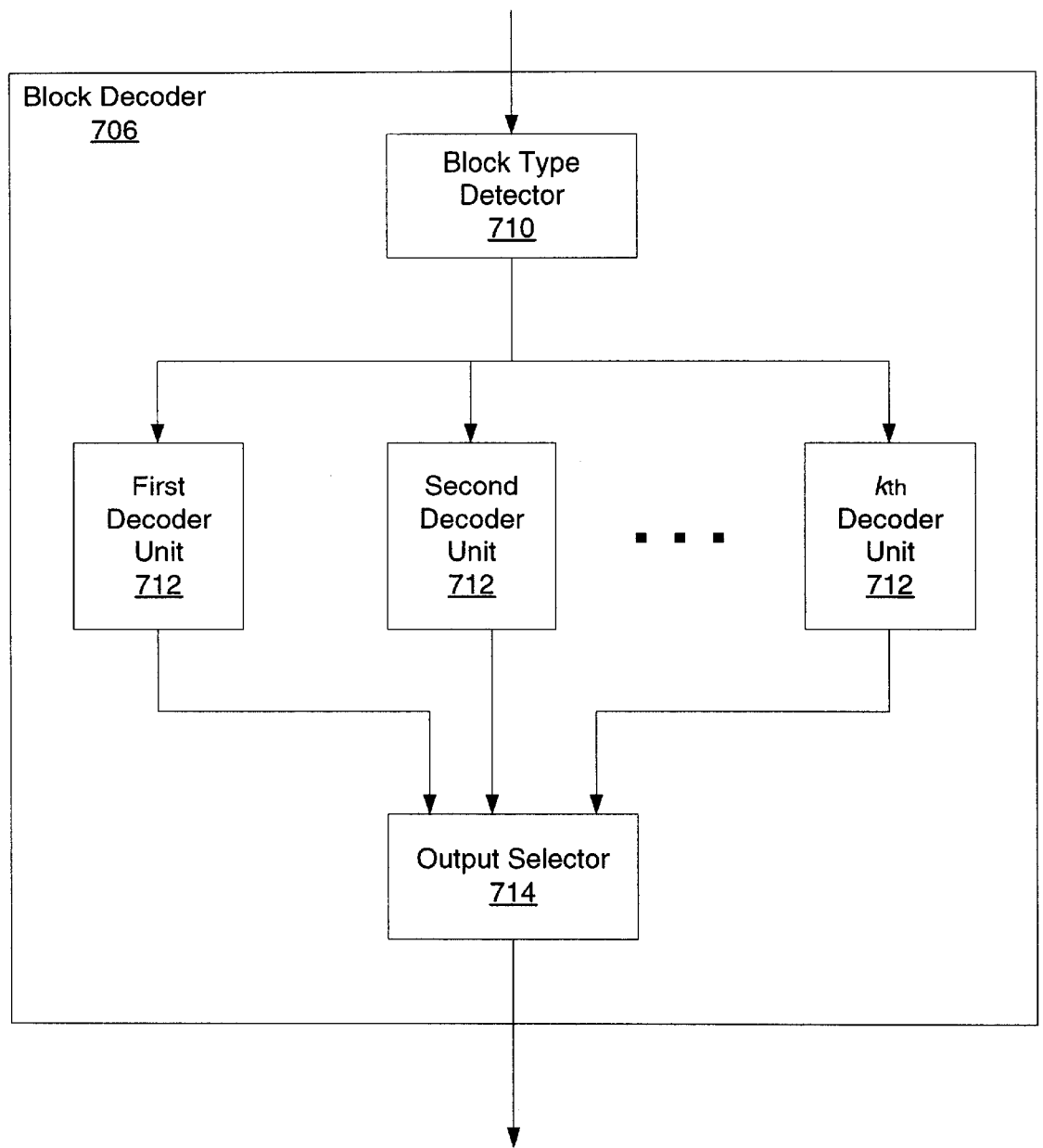
FIG. 7B is a block diagram of one embodiment of a block decoder of FIG. 7A.

FIG. 7B is a block diagram of an exemplary embodiment of a block decoder 706. Each block decoder 706 includes a block type detector 710, one or more decoder units 712, and an output selector 714. The block type detector 710 is coupled to the encoded image decomposer 702 (FIG. 7A), the output selector 714, and each of the one or more decoder units 712.

The block type detector 710 receives the encoded image blocks 514 and determines the block type for each encoded image block 516 (FIG. 5B). The block type is detected based on the codewords 520 (FIG. 5C). After the block type is determined, the encoded image blocks 514 are passed to each of the decoder units 712, which decompress or decode each encoded image block 516 to generate colors for each particular encoded image block 516. The decoder units 712 may be c-channels wide (e.g., one channel for each color component or pixel property being encoded), where c is any integer value. Using the selector signal, the block type detector 710 enables the output selector 714 to output the color of each encoded image block 516 from one of the decoder units 712 that corresponds with the block type detected by the block type detector 710. Specifically, the block type detector 710 passes a selector signal to the output selector 714 that is used to select an output corresponding to the block type detected. Alternatively, using the selector signal, the appropriate decoder unit 712 could be selected so that the encoded block is only processed through the selected decoder unit.

Figure 7C:
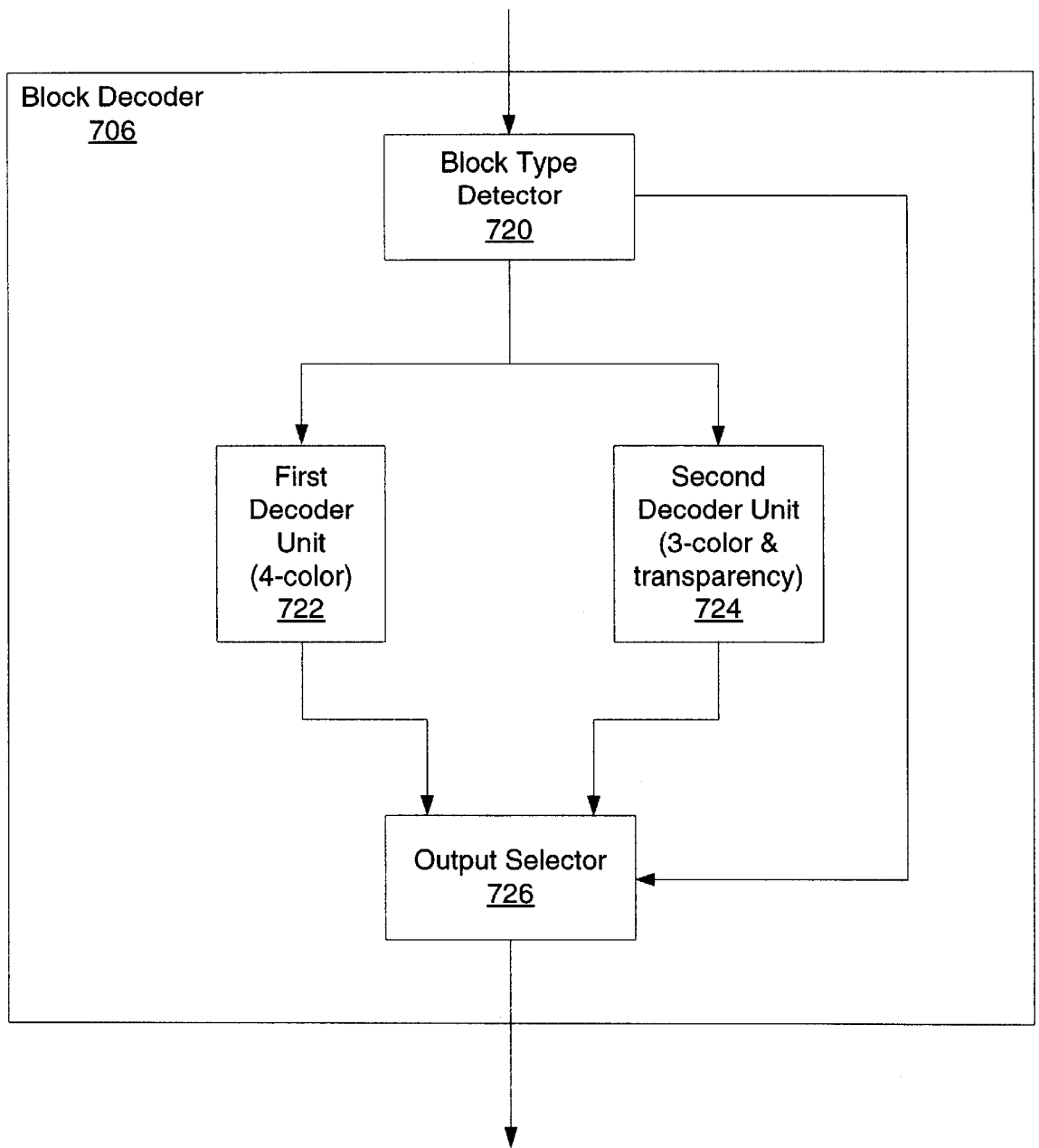
FIG. 7C is a block diagram of an alternative embodiment of a block decoder of FIG. 7A.

FIG. 7C is a block diagram of an alternative embodiment of a block decoder 706. In this embodiment, the block decoder 706 includes a block type detector 720, a first decoder unit 722, a second decoder unit 724, and an output selector 726. The block type detector 720 is coupled to receive each encoded image block 516 (FIG. 5B), and determine by comparing the codewords 520 (FIG. 5C) of the encoded image block, the block type for each encoded image block 516. For example, the block type may be four quantized colors or three quanitized colors and a transparency. Once the block type is selected and a selector signal is forwarded to the output selector 726, the encoded image blocks 516 are decoded by the first and second decoder units 722 and 724, respectively, to produce the pixel colors of each image block. The output selector 726 is enabled by the block type detector 720 to output the colors from the first and second decoder units 722 and 724 that correspond to the block type selected.

Figure 7D:
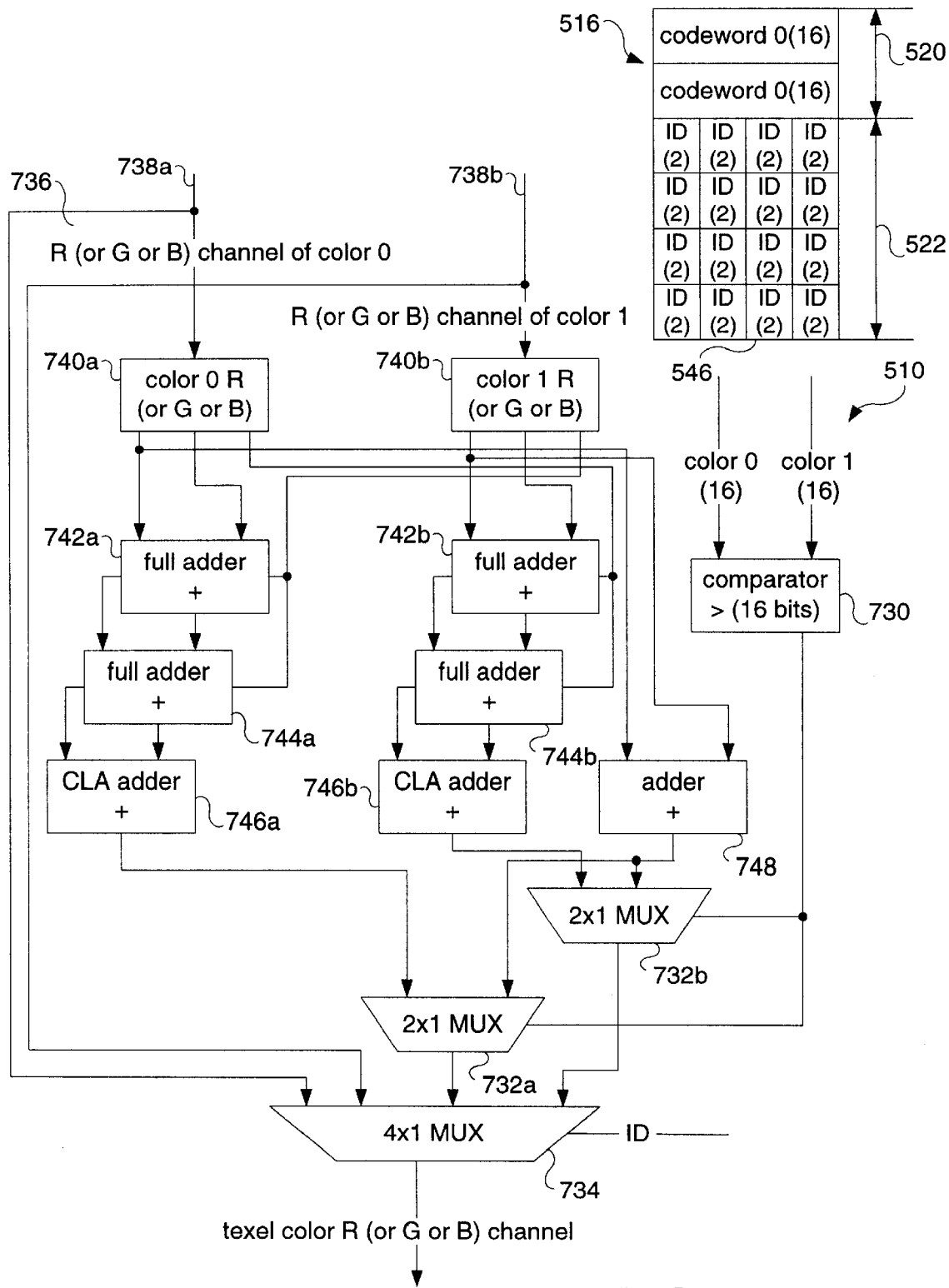
FIG. 7D is a logic diagram illustrating an exemplary decoder unit, according to the present invention.

FIG. 7D is a logic diagram illustrating an exemplary embodiment of a decoder unit similar to the decoder units 722 and 724 of FIG. 7C. For simplicity, the functionality of each of the first and second decoder units 722 and 724 is merged into the single logic diagram of FIG. 7D. Those skilled in the art will recognize that although the diagram is described with respect to a red-channel of the decoder units, the remaining channels (i.e., the green-channel and the blue-channel) are similarly coupled and functionally equivalent.

The logic diagram illustrating the first and second decoder units 722 and 724 is shown including portions of the block type detector 710, 720 (FIGS. 7B and 7C, respectively) such as a comparator unit 730. The comparator unit 730 is coupled to and works with a first 2×1 multiplexer 732a and a second 2×1 multiplexer 732b. Both 2×1 multiplexers 732a and 732b are coupled to a 4×1 multiplexer 734 that serves to select an appropriate color to output. The 4×1 multiplexer 734 is coupled to receive a transparency indicator signal that indicates whether or not a transparency (e.g., no color) is being sent. The 4×1 multiplexer 734 selects a color for output based on the value of the color index, referenced as the ID signal, that references the associated quantized color for an individual pixel of the encoded image block 514 (FIG. 5B).

A red-channel 736 of the first decoder unit 722 includes a first and a second red-channel line 738a and 738b and a first and a second red-color block 740a and 740b. Along the path of each red-color block 740*a* and 740*b* is a first full adder 742*a* and 742*b*, a second full adder 744*a* and 744*b*, and carry-look ahead ("CLA") adders 746*a* and 746*b*. The second decoder unit 724 contains similar components as the first decoder unit 722.

The CLA adder 746*a* of the first red-color block 740*a* path of the first decoder unit 722 is coupled to the first 2×1 multiplexer 732*a*, while the CLA adder 746*b* of the second red-color block 740*b* path of the first decoder unit 722 is coupled to the second 2×1 multiplexer 732*b*. Further, adder 748 of the second decoder unit 724 is coupled to both the first and the second 2×1 multiplexers 732*a* and 732*b*.

Figure 8A:
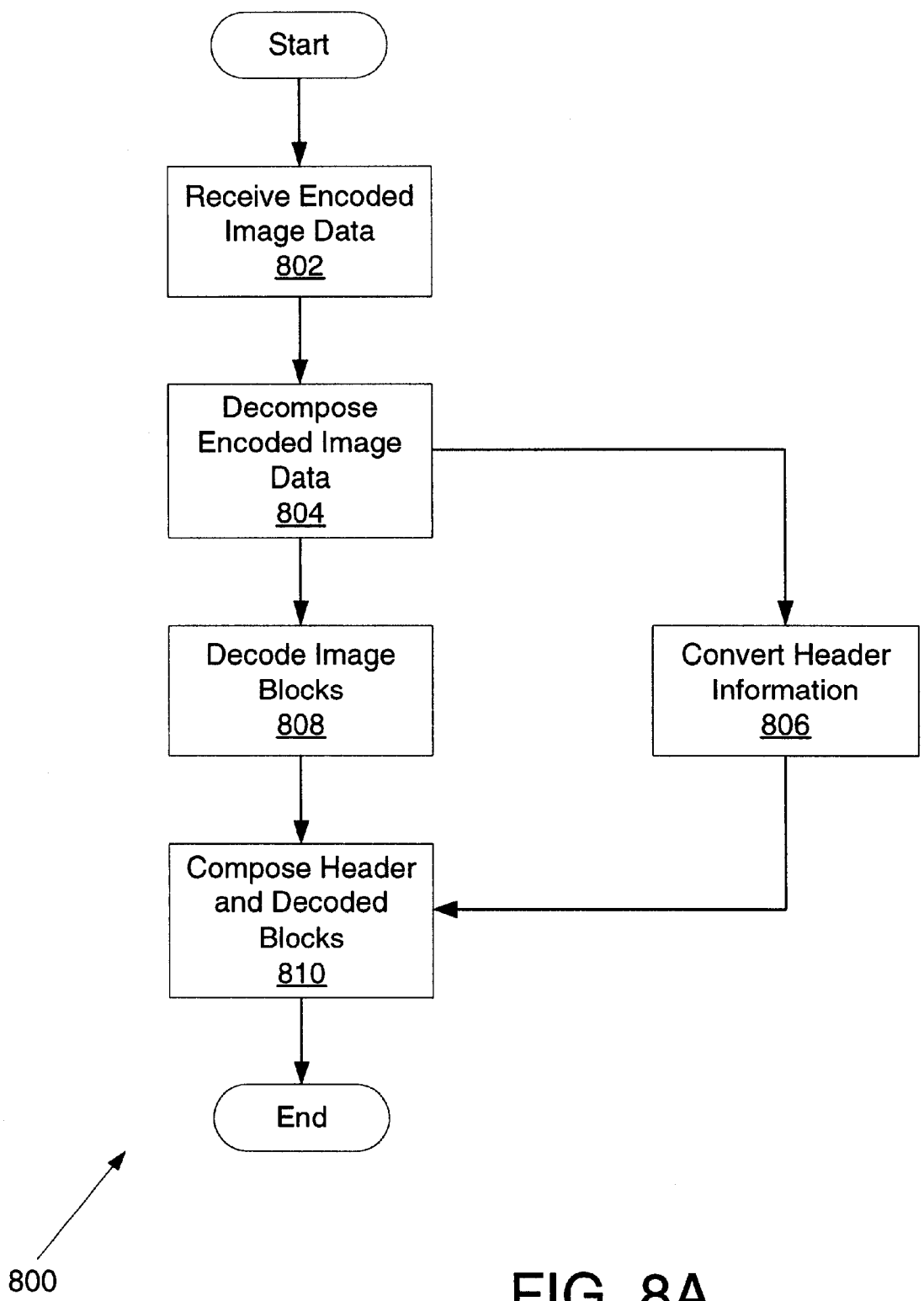
FIG. 8A is a flowchart illustrating a decoding process of the image decoder of FIG. 2.

FIG. 8A is a flowchart 800 illustrating an operation of the decoder engine 204 (FIG. 2) in accordance with an exemplary embodiment of the present invention. For purposes of illustration, the process for the decoder engine 204 will be described with a single block decoder 706 (FIG. 7A) having two decoder units 722 and 724 as described earlier in connection with FIG. 7C. Those skilled in the art will recognize that the process is functionally equivalent for decoder systems having more than one block decoder 706 and more than two decoder units 712, as discussed in connection with FIG. 7B.

In block 802, the encoded image decomposer 702 (FIG. 7A) receives the encoded or compressed image data 510 (FIG. 5B) from the image encoder engine 202 (FIG. 2), through the memory 104 (FIG. 1) or the storage device 106 (FIG. 1). Next, the encoded image decomposer 702 decomposes the encoded image data 510 by forwarding the modified header 512 (FIG. 5B) to the header converter 704 (FIG. 7A) in block 804.

Subsequently in block 806, the header converter 704 converts the header information to generate an output header that is forwarded to the image composer 708 (FIG. 7A). Simultaneously, the one or more block decoders 706 (FIG. 7A) decode pixel colors for each encoded image block 516 (FIG. 5B) in block 808. Each encoded image block 516 may be decoded sequentially in one block decoder 706 or multiple encoded image blocks 514 (FIG. 5B) may be decoded in parallel in multiple block decoders 706 in block 808. The process for decoding each encoded image block 516 is further described in connection with FIG. 8B. Each decoded image block is then composed into a data file with the converted header information by the image composer 708 in block 810. The image composer 708 then generates the data file as an output that represents the original image 310 (FIGS. 3A and 3B).

Figure 8B:
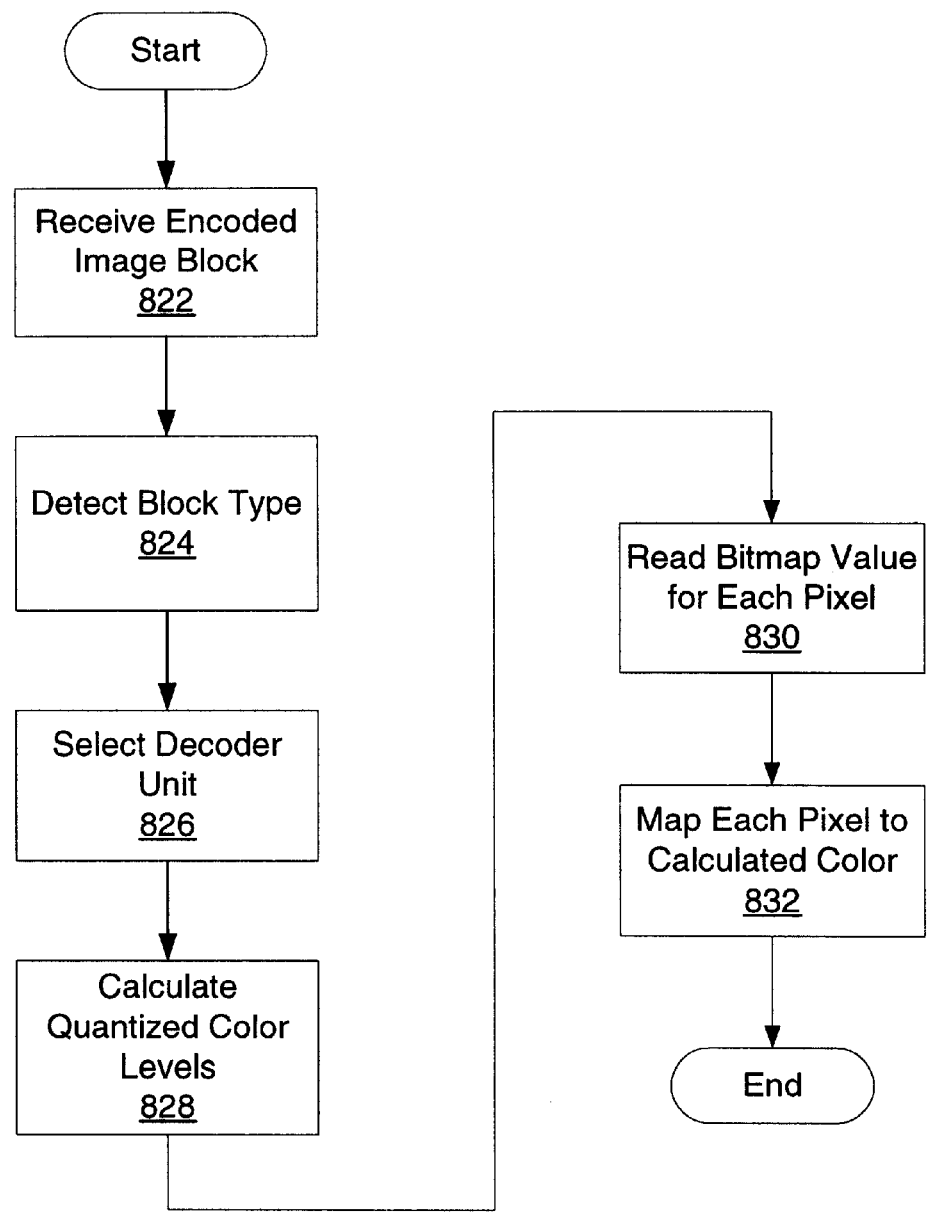
FIG. 8B is a flowchart illustrating operations of the block encoder of FIG. 7A.

FIG. 8B is a flowchart 820 illustrating an operation of the block decoder 706 (FIG. 7A) in accordance with an exemplary embodiment of the present invention. Initially, each encoded image block 516 (FIG. 5B) is received by the block decoder 706 in block 822. Specifically, for one embodiment the first and the second codewords 520 (e.g., $CW_0$ and $CW_1$ of FIG. 5C) are received by the block type detector 710, 720 (FIGS. 7B and 7C, respectively) of the block decoder 706. As discussed above, comparing the numerical values of $CW_0$ and $CW_1$ reveals the block type. The first five bits of each codeword 520 that represent the red-channel color are received by the red-channel of each of the first and second decoder units 722 and 724 (FIG. 7C). Furthermore, the second 6-bits of each codeword 520 that represent the green-channel color are received by the green-channel of each of the first and the second decoder units 722 and 724, while the last 5-bits of each codeword 520 that represent the blue-channel color are received by the blue-channel of each of the first and second decoder units 722 and 724.

Next in block 824, the block type detector 710 detects the block type for an encoded image block 514. Specifically, the comparator 730 (FIG. 7D) compares the first and the second codewords 520 (e.g., $CW_0$ and $CW_1$) and generates a flag signal to enable the first 2×1 multiplexer 732*a* or the second 2×1 multiplexer 732*b*. In block 826, either the first decoder unit 722 or the second decoder unit 724 is selected.

Subsequently quantized color levels for the decoder units 722 and 724 are calculated in block 828. The calculation of the quantized color levels will now be discussed in more detail. Initially, the first decoder unit 722 calculates the four colors associated with the two codewords 520 (e.g., $CW_0$ and $CW_1$) using the following exemplary relationship:

$CW_0$=first codeword=first color;

$CW_1$=second codeword=second color;

$$CW_2 = \text{third color} = \frac{2}{3}CW_0 + \frac{1}{3}CW_1; \text{ and}$$

$$CW_3 = \text{fourth color} = \frac{1}{3}CW_0 + \frac{2}{3}CW_1.$$

In one embodiment, the first decoder unit 722 may estimate the above equations for $CW_2$ and $CW_3$ as follows:

$$CW_2 = \frac{5}{8}CW_0 + \frac{3}{8}CW_1; \text{ and}$$

$$CW_3 = \frac{3}{8}CW_0 + \frac{5}{8}CW_1.$$

The red-color blocks 740*a* and 740*b* (FIG. 7D) serve as one-bit shift registers to obtain $$\frac{1}{2}CW_0 \text{ or } \frac{1}{2}CW_1.$$

Further, each full adder 742*a*, 742*b*, 744*a*, and 744*b* (FIG. 7D) also serves to shift the signal left by 1-bit. Thus, the signal from the first full adders 742*a* and 742*b* is $$\frac{1}{4}CW_0 \text{ or } \frac{1}{4}CW_1,$$

respectively, because of a 2-bit overall shift, while the signal from the second full adders 744*a* and 744*b* is $$\frac{1}{8}CW_0 \text{ or } \frac{1}{8}CW_1,$$

respectively due to a 3-bit overall shift. These values allow for the above approximations for the color signals.

The second decoder unit 724 (FIG. 7C) calculates three colors associated with the codewords 520 (e.g., $CW_0$ and $CW_1$), and includes a fourth signal that indicates a transparency is being passed. The second decoder unit 724 calculates colors using the following exemplary relationship:

$CW_0$=first codeword=first color;

$CW_1$=second codeword=second color;

$$CW_3 = \text{third color} = \frac{1}{2}CW_0 + \frac{1}{2}CW_1; \text{ and}$$

T=Transparency.

In one embodiment, the second decoder unit 724 has no approximation because the signals received from the red-color blocks 740a and 740b are shifted left by 1-bit so that the color is already calculated to $$\frac{1}{2}CW_0 \text{ or } \frac{1}{2}CW_1,$$

respectively.

After the quantized color levels for the decoder units 722 and 724 selected in block 826 have been calculated in block 828, each bitmap value for each pixel is read from the encoded image data block 510 (FIG. 5A) in block 830. As each index is read, it is mapped in block 832 to one of the four calculated colors if the first decoder unit 722 is selected. Alternatively, one of the three colors and transparency is mapped in block 832 if the second decoder unit 724 is selected. The mapped colors are selected by the 4×1 multiplexer 734 based on the value of the ID signal from the bitmap 522 (FIG. 5C) of the encoded image block 514. As stated previously, a similar process occurs for selection of colors in the green-channel and the blue-channel.

As the color data are output from the red-channel, green-channel and blue-channel, the output is received by the image composer 708 (FIG. 7A). Subsequently, the image composer 708 arranges the output from the block encoders 706 in the same order as the original image 310 was decomposed. The resulting image is the original image 310, which is then forwarded to an output unit 208 (FIG. 2; e.g., a computer screen) which displays the image.

Figure 9A:
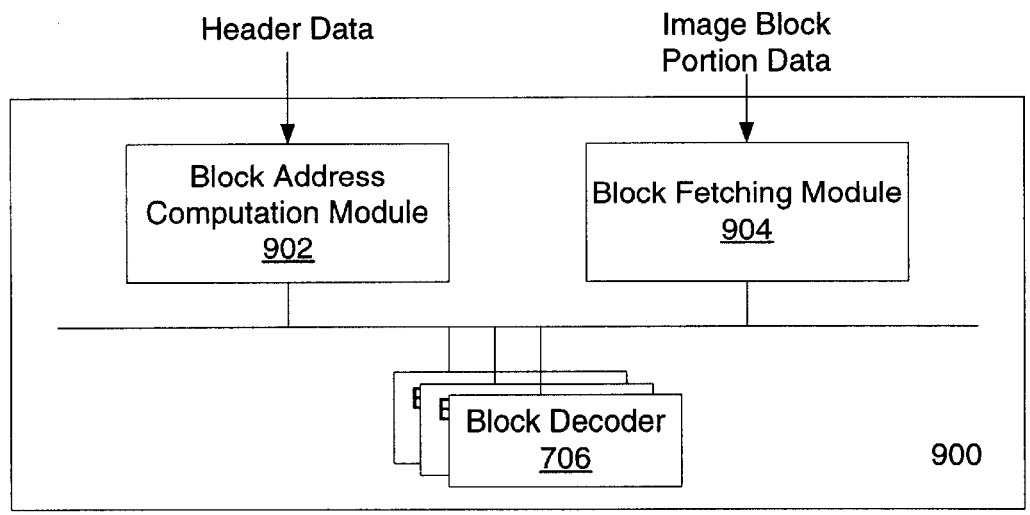
FIG. 9A is a block diagram of a subsystem for random access to a pixel or an image block.

This exemplary embodiment beneficially allows for random access to any desired image block 320 (FIG. 3C) within an image, and any pixel 322 (FIG. 3C) within an image block 320. FIG. 9A is a block diagram of a subsystem 900 that provides random access to a pixel 322 or an image block 320 in accordance with one embodiment of the present invention.

The random access subsystem 900 includes a block address computation module 902, a block fetching module 904, and one or more block decoders 706 coupled to the block address computation module 902 and the block fetching module 904. The block address computation module 902 receives the header information 512 (FIG. 5B) of the encoded image data string 510 (FIG. 5B), while the block fetching module 904 receives the encoded image block portion 514 (FIG. 5B) of the encoded image data string 510.

Figure 9B:
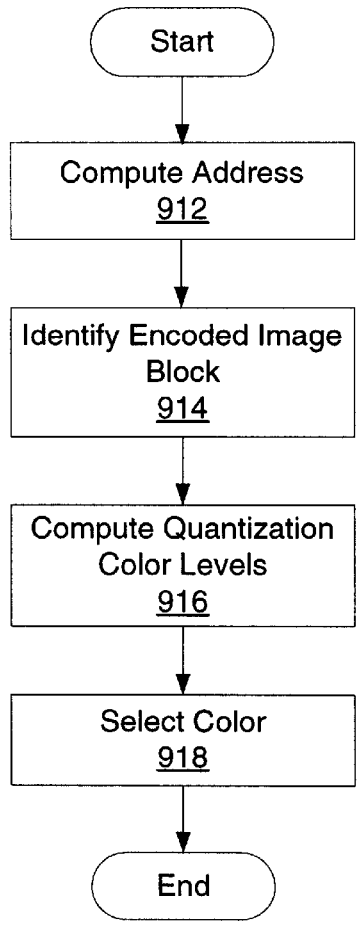
FIG. 9B is a flowchart illustrating random access to a pixel or an image block.

FIG. 9B is a flowchart 910 of a process for random access to a pixel 322 (FIG. 3C) or an image block 320 (FIG. 3C) using the random access subsystem 900 of FIG. 9A. When particular pixels 322 have been identified for decoding, the image decoder engine 204 (FIG. 2) receives the encoded image data string 510 (FIG. 5B). The modified header 512 (FIG. 5B) of the encoded image data string 510 is forwarded to the block address computation module 902 (FIG. 9A), and the encoded image block portion 514 (FIG. 5B) of the encoded image data string 510 is forwarded to the block fetching module 904 (FIG. 9A).

In block 912, the block address computation module 902 reads the modified header 512 to compute an address of the encoded image block portion 514 having the desired pixels 322. The address computed is dependent upon the pixel coordinates within an image. Using the computed address, the block fetching module 904 identifies each encoded image block 516 (FIG. 5B) of the encoded image block portion 514 that contains the desired pixels 322 in block 914. Once each encoded image block 516 having the desired pixels 322 has been identified, only the identified encoded image block 516 is forwarded to the block decoders 706 (FIG. 9A) for processing.

FIG. 9B is similar to the process described above in FIG. 8B, wherein the block decoders 706 compute quantized color levels for each identified encoded image blocks 516 having the desired pixels in block 916. After the quantized color levels have been computed, the color of the desired pixel is selected in block 918 and output from the image decoder engine 204.

Random access to pixels 322 of an image block 320 (FIG. 3C) advantageously allows for selective decoding of only needed portions or sections of an image. Random access also allows the image to be decoded in any order the data is required. For example, in three-dimensional texture mapping only portions of the texture may be required and these portions will generally be required in some non-sequential order. Thus, this embodiment of the present invention increases processing efficiency and performance when processing only a portion or section of an image. Further, the present invention beneficially encodes or compresses the size of an original image 310 (FIGS. 3A and 3B) from 24-bits per pixel to an aggregate 4-bits per pixel, and then decodes or decompresses the encoded image data string 510 (FIG. 5B) to get a representation of the original image 310. Additionally, the exemplary embodiment uses two base points or codewords from which additional colors are derived so that extra bits are not necessary to identify a pixel 322 color.

Moreover, the exemplary embodiment advantageously accomplishes the data compression on an individual block basis with the same number of bits per block so that the compression rate can remain fixed. Further, because the blocks are of fixed size with a fixed number of pixels 322, random access to any particular pixel 322 in the block is allowed. Additionally, an efficient use of system resources is provided because entire blocks of data are not retrieved and decoded to display data corresponding to only a few pixels 322.

Finally, the use of fixed-rate 64-bit data blocks provides the advantage of having simplified header information that allows for faster processing of individual data blocks. A 64-bit data block allows for faster processing as the need to wait until a full data string is assembled is eliminated. Further, an imaging system in accordance with the present invention may also reduce the microchip space necessary for a decoder system because the decoder system only needs to decode each pixel 322 to a set of colors determined by, for example, the two codewords 520 (FIG. 5C).

The present invention has been described above with reference to specific embodiments. It will be apparent to those skilled in the art that various modifications may be made and other embodiments can be used without departing from the broader scope of the invention. Therefore, these and other variations upon the specific embodiments are intended to be covered by the present invention.

What is claimed is:

1. An image encoder engine for encoding an image, comprising:
    an image decomposer for decomposing the image into a header and at least one image block, each image block having a set of image elements and each image element having an original image data value;
    at least one block encoder for receiving each image block and for compressing each image block into an encoded image block by associating each original image data value of the image element with an index to a derived image data value in a set of quantized image date values; and
    an encoded image composer coupled to the block encoder for ordering the encoded image blocks into a data file.

2. The image encoder engine of claim 1 further comprising a header converter coupled to the image decomposer for converting the header into a modified header.

3. The image encoder engine of claim 2 wherein the encoded image composer orders the encoded image block and the modified header into a data file.

4. The image encoder engine of claim 1 wherein the block encoder further comprises a selection module for computing a set of parameters from the image data values of the set of image elements.

5. The image encoder engine of claim 1 wherein the block encoder further comprises a codeword generation module for generating at least one codeword.

6. The image encoder engine of claim 1 wherein the block encoder further comprises a construction module for generating the set of quantized image data values including at least one codeword and at least one derived image data value.

7. The image encoder engine of claim 1 wherein the block encoder further comprises a block type module for selecting an identifiable block type for the image block.

8. An image decoder engine for decoding an encoded image data file, comprising:
   an encoded image decomposer for decomposing the encoded image data file into a modified header and at least one compressed image block, each image block having at least one associated codeword and a plurality of image elements associated with an index value;
   at least one block decoder coupled to the encoded image decomposer for decompressing the at least one compressed image block into at least one decompressed image block by generating a set of quantized image data values and mapping the index value to a quantized image data value from the set of quantized image data values; and
   an image composer for ordering the at least one decompressed image blocks in an output data file.

9. The image decoder engine of claim 8 wherein the set of quanitized image data values include the at least one codeword and at least one image data value derived from the at least one codeword.

10. The image decoder engine of claim 8 further comprising a header converter coupled to the encoded image decomposer for converting the modified header into an output header.

11. The image decoder engine of claim 10 wherein the image composer orders the at least one decompressed image block and the output header into a data file.

12. The image decoder engine of claim 8 wherein the at least one block decoder further comprises a block type detector for selecting a block type for each of the at least one compressed image block.

13. The image decoder engine of claim 8 wherein the at least one block decoder further comprises a decoder for decompressing each of the at least one compressed image block based on a block type.

14. The image decoder engine of claim 8 wherein the at least one block decoder further comprises an output selector for outputting the at least one decompressed image block.

15. A method for fixed-rate block-based image compression of an original image, comprising the steps of:
   decomposing the original image into a header and a plurality of image blocks each having a set of image elements with an original image data value;
   computing at least one codeword from the original image data value for the set of image elements;
   generating a set of quantized image data values including the at least one codeword and at least one image value derived from the at least one codeword; and
   mapping the original image data value to one of the quantized image data values to produce an index value for each image element.

16. The method of claim 15 further comprising outputting an encoded image data file.

17. The method of claim 15 further comprising the step of converting the header into a modified header.

18. The method of claim 17 further comprising the step of composing the modified header and encoded image blocks into the encoded image data file.

19. A machine readable medium having embodied thereon a program being executable by a machine to perform method steps for fixed-rate block-based image compression of an original image, the method steps comprising:
   decomposing the original image into a header and a plurality of image blocks each having a set of image elements with an original image data value;
   computing at least one codeword from the original image data value for the set of image elements;
   generating a set of quantized image data values including the at least one codeword and at least one image value derived from the at least one codeword; and
   mapping the original image data value to one of the quantized image data values to produce an index value for each image element.

20. The machine readable medium of claim 19 further comprising the method of outputting an encoded image data file.

21. An image encoder system for encoding an original image, comprising:
   means for decomposing the original image into a header and a plurality of image blocks each having a set of image elements with an original image data value;
   means for computing at least one codeword from the original image data value for the set of image elements;
   means for generating a set of quantized image data values including the at least one codeword and at least one image value derived from the at least one codeword; and
   means for mapping the original image data value to one of the quantized image data values to produce an index value for each image element.

22. The image encoder system of claim 21 further comprising means for outputting an encoded image data file.

23. A method for fixed-rate block-based image decompression of an encoded image, comprising the steps of:
   decomposing the encoded image of into a modified header and a plurality of encoded image blocks having at least one codeword and a plurality of image elements associated with an index value;
   generating a set of quanitized image data values including the at least one codeword and at least one image value derived from the at least one codeword; and
   mapping the index value for each image element to one of the quantized image data values.

24. The method of claim 23 further comprising outputting a decoded image data file.

25. The method of claim 23 further comprising the step of converting the modified header into an output header.

26. The method of claim 25 further comprising the step of composing the output header and decoded image blocks into the decoded image data file.

27. A machine readable medium having embodied thereon a program being executable by a machine to perform method steps for fixed-rate block-based image decompression of an encoded image, the method steps comprising:
  decomposing the encoded image data file into a modified header and a plurality of encoded image blocks having at least one codeword and a plurality of image elements associated with an index value;
  generating a set of quanitized image data values including the at least one codeword and at least one image value derived from the at least one codeword; and
  mapping the index value for each image element to one of the quantized image data values.

28. The machine readable medium of claim 27 further comprising the method of outputting a decoded image data file.

29. An image decoder engine for decoding an encoded image data file, comprising means for decomposing the encoded image data file into a modified header and a plurality of encoded image blocks having at least one codeword and a plurality of image elements associated with an index value;
  means for generating a set of quanitized image data values including the at least one codeword and at least one image value derived from the at least one codeword; and
  means for mapping the index value for each image element to one of the quantized image data values.

30. The image decoder engine of claim 29 further comprising means for outputting a decoded image data file.

* * * * *

INTER PARTES REEXAMINATION CERTIFICATE (1106th)

United States Patent
Hong et al.

(10) Number: US 6,775,417 C1
(45) Certificate Issued: May 12, 2015

(54) FIXED-RATE BLOCK BASED IMAGE COMPRESSION WITH INFERRED PIXEL VALUES

(75) Inventors: Zhou Hong, Cupertino, CA (US); Konstantine I. Iourcha, San Jose, CA (US); Krishna S. Nayak, Palo Alto, CA (US)

(73) Assignee: S3 GRAPHICS CO., LTD., Grand Cayman (KY)

Reexamination Request:
No. 95/000,585, Nov. 5, 2010

Reexamination Certificate for:
Patent No.: 6,775,417
Issued: Aug. 10, 2004
Appl. No.: 10/052,613
Filed: Jan. 17, 2002

Related U.S. Application Data

(63) Continuation-in-part of application No. 09/361,930, filed on Jul. 12, 1999, now Pat. No. 6,658,146, which is a continuation of application No. 08/942,860, filed on Oct. 2, 1997, now Pat. No. 5,956,431.

(51) Int. Cl.
*G06K 9/38* (2006.01)
*G06T 9/00* (2006.01)

(52) U.S. Cl.
CPC .................................... *G06T 9/008* (2013.01)

(58) Field of Classification Search
None
See application file for complete search history.

(56) References Cited

To view the complete listing of prior art documents cited during the proceeding for Reexamination Control Number 95/000,585, please refer to the USPTO's public Patent Application Information Retrieval (PAIR) system under the Display References tab.

*Primary Examiner* — Henry N Tran

(57) ABSTRACT

An image processing system including an image encoder and image decoding system is provided. The image encoder system includes an image decomposer, a block encoder, and an encoded image composer. The image decomposer decomposes the image into blocks. The block encoder which includes a selection module, a codeword generation module and a construction module, processes the blocks. Specifically, the selection module computes a set of parameters from image data values of a set of image elements in the image block. The codeword generation module generates codewords which the construction module uses to derive a set of quantized image data values. The construction module then maps each of the image element's original image data values to an index to one of the derived image data values. The image decoding system reverses this process to reorder decompressed image blocks in an output data file.

Attention is directed to the decision of US ITC 337-TA-724 *S3 Graphics Co. Ltd et al.* v. *Apple, Inc* (75 Fed. Reg. 38118 (Jul. 1, 2010); Feb. 1, 2013 (Publication 4374), in which claims 7, 12, 15, and 23 of the '417 patent were held to be invalid (see id. at page 276 - item 16). This reexamination may not have resolved all questions raised by this decision. See 37 CFR 1.552(c) for *ex parte* reexamination and 37 CFR 1.906(c) for *inter partes* reexamination.

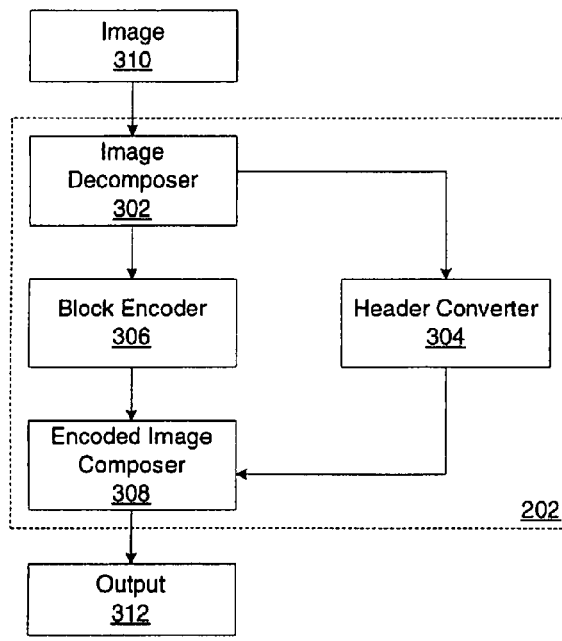

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1, 7, 8, 12, 13, 15 and 23 are cancelled.

Claims 2-6, 9-11, 14, 16-22 and 24-30 were not reexamined.

Claims 7, 12, 15, and 23 of the '417 patent were held to be invalid in the final decision on Feb. 1, 2013 by the US ITC (Publication 4374 at pages 276-item 16) (investigation No. 337-TA-724).

\* \* \* \* \*